US012769143B2

(12) United States Patent
Johlin

(10) Patent No.: US 12,769,143 B2
(45) Date of Patent: Oct. 20, 2026

(54) DIELECTRIC SPLITTER FOR USE IN IMAGING

(71) Applicant: THE UNIVERSITY OF WESTERN ONTARIO, London (CA)

(72) Inventor: Eric Johlin, London (CA)

(73) Assignee: The University of Western Ontario, London (CA)

( * ) Notice: Subject to any disclaimer, the term of this patent is extended or adjusted under 35 U.S.C. 154(b) by 79 days.

(21) Appl. No.: 18/843,633

(22) PCT Filed: Mar. 4, 2022

(86) PCT No.: PCT/CA2022/050319
§ 371 (c)(1),
(2) Date: Sep. 3, 2024

(87) PCT Pub. No.: WO2023/164754
PCT Pub. Date: Sep. 7, 2023

(65) Prior Publication Data
US 2025/0180920 A1 Jun. 5, 2025

(51) Int. Cl.
*G02B 27/10* (2006.01)
*H10F 39/00* (2025.01)

(52) U.S. Cl.
CPC ....... *G02B 27/1013* (2013.01); *H10F 39/806* (2025.01); *G02B 2207/101* (2013.01)

(58) Field of Classification Search
CPC .......... G02B 27/1013; G02B 2207/101; G02B 1/002; H10F 39/806; B82Y 20/00
See application file for complete search history.

(56) References Cited

U.S. PATENT DOCUMENTS 5,385,114 A 1/1995 Milstein et al.
8,063,352 B2 * 11/2011 Blayvas .................. G01J 3/502 250/226

(Continued)

FOREIGN PATENT DOCUMENTS

WO WO 2022/023170 A1 2/2022

OTHER PUBLICATIONS

Xiao, T et al., "Diffractive Spectral-Splitting Optical Element Designed by Adjoint-Based Electromagnetic Optimization and Fabricated by Femtosecond 3D Direct Laser Writing", ACS Photonics 2016, 3: 886-894.

(Continued)

*Primary Examiner* — Thanh Luu
(74) *Attorney, Agent, or Firm* — Knobbe, Martens, Olson & Bear, LLP

(57) ABSTRACT

An image sensor including: a splitter including a block of structured dielectric material with a plurality of nano-photonic geometric structures formed therein, an incident electromagnetic radiation split into a plurality of substantially parallel beams of spectrally distinct electromagnetic wavelength ranges by transmission through the plurality of nano-photonic geometric structures; the block having an input surface for receiving the incident electromagnetic radiation and an output surface for transmitting the plurality of substantially parallel beams of spectrally distinct electromagnetic wavelength ranges, the input surface and the output surface independently communicative with the plurality of nano-photonic geometric structures; a pixel configured photo-detector array providing an active layer surface receiving the plurality of substantially parallel beams of spectrally distinct electromagnetic wavelength ranges; the active layer surface oriented in facing opposition to the output surface of the block, a separation of the active layer (Continued)

surface and the output surface being less than 500 nanometers.

27 Claims, 17 Drawing Sheets

(56) References Cited

U.S. PATENT DOCUMENTS

| | | | |
|---|---|---|---|
| 9,507,064 | B2 | 11/2016 | Brongersma et al. |
| 10,725,290 | B2 | 7/2020 | Fan et al. |
| 11,239,276 | B2 | 2/2022 | Roberts et al. |
| 2003/0118799 | A1 | 6/2003 | Miller et al. |
| 2011/0121422 | A1 | 5/2011 | Saitou et al. |
| 2020/0124866 | A1 | 4/2020 | Camayd-Munoz et al. |
| 2021/0223444 | A1 | 7/2021 | Siddique et al. |

OTHER PUBLICATIONS

Chen, Q et al., "Nanophotonic Image Sensors", Small 2016, 12, No. 36: 4922-4935.

Camayd-Munoz, P et al., "Multifunctional volumetric meta-optics for color and polarization image sensors"; Optica vol. 7, No. 4, 280-283, published Mar. 31, 2020.

Zhao et al., "Perfect RGB-IR Color Routers for Sub-Wavelength Size CMOS Image Sensor Pixels"; Advanced Photonics Research 2, 2000048, published Jan. 27, 2021.

Johlin, "Nanophotonic color splitters for high-efficiency imaging"; iScience 24, 102268, published Apr. 23, 2021.

Chen, M et al., "Full-color Nanorouter for High-Resolution Imaging"; Nanoscale, 2021, 13, 13024.

Chen, Q et al., "Nanophotonic Color Routing"; Advanced Materials. 2021, 2103815 (in 22 pages).

International Search Report and Written Opinion in PCT/CA2022/050319, mailed Oct. 3, 2022.

* cited by examiner

DIELECTRIC SPLITTER FOR USE IN IMAGING

CROSS REFERENCE TO RELATED APPLICATIONS

This application is the U.S. National Phase of International Application No. PCT/CA2022/050319, filed Mar. 4, 2022, designating the U.S. and published in English as WO 2023/164754 A1 on Sep. 7, 2023.

BACKGROUND OF THE INVENTION

Field of the Invention

The present invention relates to digital imaging, and more particularly to splitting incident electromagnetic radiation to match a pixel pattern of an image sensor.

Description of the Related Art

Digital imaging and digital image sensors are pervasive. The two main types of digital image sensors are charge-coupled device (CCD) and active-pixel sensor (CMOS sensor), fabricated in complementary metal-oxide-semiconductor (CMOS) or N-type MOS (NMOS or Live MOS) technologies. Both CCD and CMOS sensors are based on metal-oxide semiconductor (MOS) technology, with MOS capacitors being the building blocks of a CCD, and MOSFET amplifiers being the building blocks of a CMOS sensor.

Digital image sensors are used in electronic imaging devices that benefit everyday consumer implementations as well as specialized industry workflow, such devices including for example, digital cameras, camera modules, camera phones, optical mouse devices, medical imaging equipment, night vision equipment such as thermal imaging devices, microwave imaging devices, among others. Increased dependence of high-resolution cameras containing digital image sensors can be found in mobile, automotive, and medical and life science applications. For example, Sony optronics provides a CMOS HD camera image sensor for digital mammography. In other examples, CMOS cameras can reproduce color variations and details for endoscopy and surgical imaging systems, while digital pathology cameras incorporated into microscopes and whole slide scanners, capture human tissue slices, biopsy tests, and cell samples.

Image sensors typically incorporate components that alter, manipulate or process incident electromagnetic radiation such as filters, splitters, collimating lenses, focusing lenses, and the like. Many image sensors benefit from spectral separation of incident electromagnetic radiation, typically incorporating filters or splitters to transmit spectrally distinct beams onto a pixel configured photo-detector array. For example, in color imaging, image sensors typically need to incorporate a color selecting or color separating component as the base photo-sensor of an image sensor detects light intensity with little or no wavelength specificity and therefore cannot separate color information. For color imaging, a digital image sensor incorporating a color filter array or a color splitter is common.

Color imaging is most commonly achieved through absorptive Bayer color filter arrays, with each of three color pixel filters allowing approximately ⅓ of the incident light to transmit to the active material layer of the photo-sensor of the image sensor. Thus, selectivity of individual colors is disadvantaged by losses of transmitted intensity.

An alternative approach to filtering is splitting the incident light by color, redirecting the appropriate wavelength range to a corresponding pixel. Theoretically, this can increase the light intensity to the active material of the image sensor on average by 3×. Color splitting for imaging applications has been investigated previously through fairly complex processes, often involving high-index (for example, a refractive index greater than 2) material processing steps, and computationally expensive image reconstructions. Many designs additionally only work with a specific polarization of light, limiting their efficiency for common imaging applications.

Accordingly, there is a continuing need for alternative components to direct incident electromagnetic radiation to active material of an image sensor.

SUMMARY OF THE INVENTION

In an aspect there is provided an image sensor comprising:

- a splitter comprising a block of structured dielectric material with a plurality of nano-photonic geometric structures formed therein, an incident electromagnetic radiation split into a plurality of substantially parallel beams of spectrally distinct electromagnetic wavelength ranges by transmission through the plurality of nano-photonic geometric structures;
- the block having an input surface for receiving the incident electromagnetic radiation and an output surface for transmitting the plurality of substantially parallel beams of spectrally distinct electromagnetic wavelength ranges, the input surface and the output surface independently communicative with the plurality of nano-photonic geometric structures;
- a pixel configured photo-detector array providing an active layer surface receiving the plurality of substantially parallel beams of spectrally distinct electromagnetic wavelength ranges;
- the active layer surface oriented in facing opposition to the output surface of the block, a separation of the active layer surface and the output surface being less than 500 nanometers.

In another aspect there is provided an image sensor comprising:

- a splitter having an input surface for receiving an incident electromagnetic radiation and an output surface for transmitting a plurality of beams of spectrally distinct electromagnetic wavelength ranges, with a minimum focus distance of less than 200 nm relative to the output surface;
- a pixel configured photo-detector array providing an active layer surface receiving the plurality of beams of spectrally distinct electromagnetic wavelength ranges;
- the active layer surface oriented in facing opposition to the output surface of the block, a separation of the active layer surface and the output surface being less than 400 nanometers.

BRIEF DESCRIPTION OF THE DRAWINGS

FIG. 5*a* Isometric-view rendering, and FIG. 5*b* top-view of color-coded layers for the four-layer topology-optimized splitter structure. FIG. 5*c* Isometric view, and FIG. 5*d* top-view average density projection of fully 3D splitter structure. Dashed lines in FIG. 5*a* and FIG. 5*c* represent the actively-simulated region.

FIG. 6*a* and FIG. 6*b* show Poynting vector $\hat{z}$-component (toward the sensor) within the three color bands (red, green, blue), visualized at the sensor surface. Pixel active regions are shown as dashed lines. FIG. 6*c* and FIG. 6*d* plot transmission of light from the full 2×2 pixel region into the sensor active region for the three different pixel colors. The 3D splitter (solid lines) shows lower selectivity than the Bayer filter (dashed lines), but the much higher transmissivity still leads to twice the color-corrected efficiency (34% vs. 17%, respectively).

FIG. 7*a*: Pixel transmission density functions for color splitters and Bayer filters, in color-corrected (solid) and grayscale (dashed) imaging, for the given test image. FIG. 7*b*: Reference image assuming perfect splitting at 50% efficiency. FIG. 7*c*, 7*d*: Color corrected simulated images for comparing filter and splitter performance, respectively. FIG. 7*e*, 7*f*: Grayscale simulated images for filter and splitter, respectively.

FIG. 8*a*: Splitter performance, in terms of relative color-corrected imaging efficiency, shown for both in color (blue) and grayscale (red) imaging. Performance is normalized to Bayer filters with assumed perfect microlens structures (black solid), with the performance without such lenses shown as well (black dashed). Single- and two-layer structure geometries are shown in FIG. 8*b* and FIG. 8*c*, respectively.

DETAILED DESCRIPTION OF PREFERRED EMBODIMENTS

Figure 1:
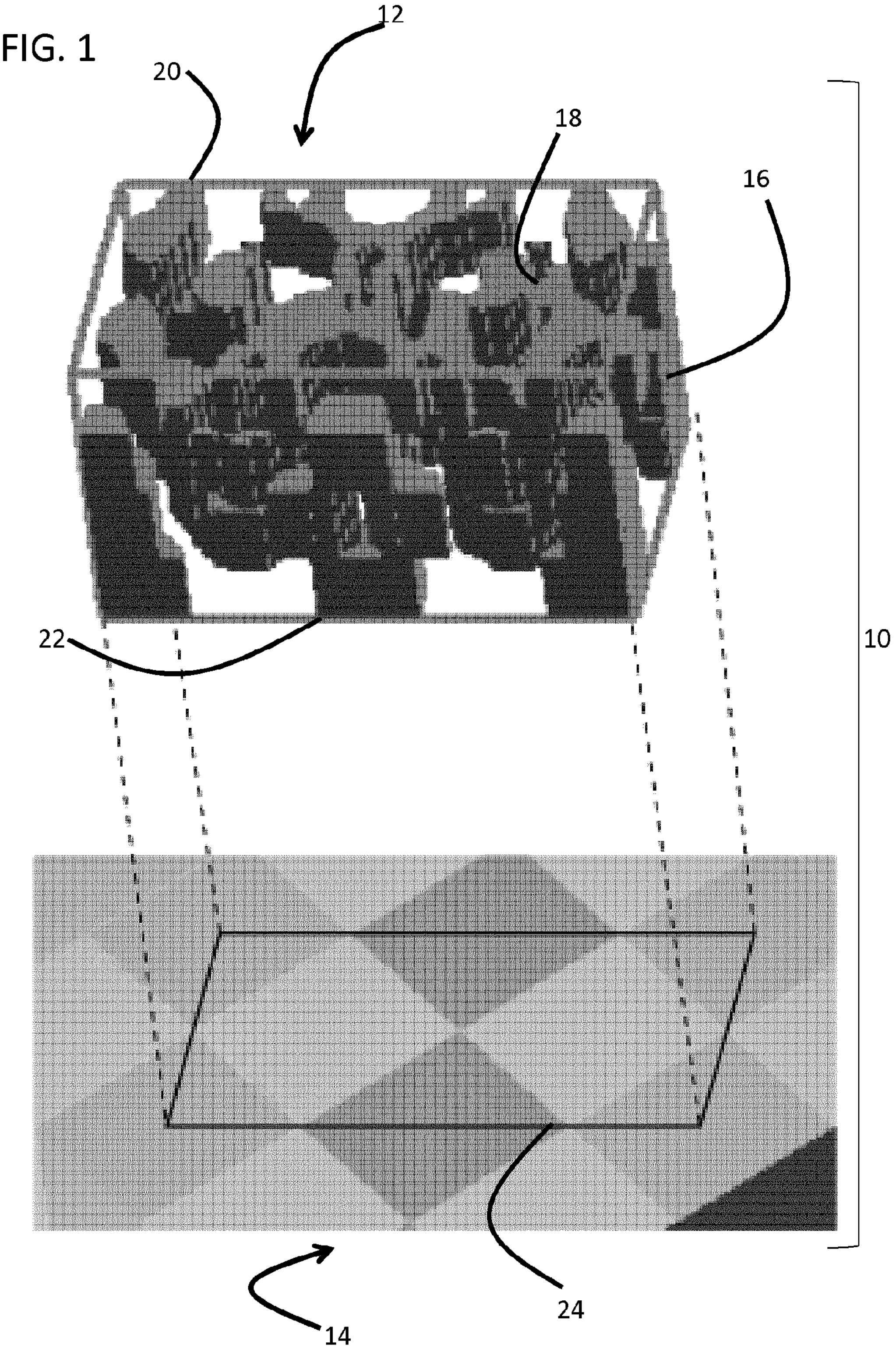
FIG. 1 shows an exploded perspective view of an image sensor comprising a splitter and a pixel configured photo-detector array.

Described herein is a dielectric splitter for spectrally separating incident electromagnetic radiation into a plurality of spectrally distinct wavelength ranges or bands in a directional pattern that match an associated pixel configured photo-detector array. The splitter may be made of one or more dielectric materials having a low refractive index (for example, a refractive index less than 2) and can readily be constructed with a single dielectric material having a low refractive index.

An image sensor 10 incorporating the dielectric splitter 12 and a matching associated pixel configured photo-detector array 14 can provide digital imaging in multiple implementations including consumer electronics, medical imaging, thermal imaging, among others.

A pixel configured photo-detector array can at times conventionally be referred to as a sensor, and therefore photo-detector, photo-sensor, and sensor may be used interchangeably. However, image sensor is distinguished from sensor in that image sensor includes both the splitter and the photo-detector array, while sensor may refer to the photo-detector array alone.

The dielectric splitter 12 comprises a block 16 of structured dielectric material with a plurality of nano-photonic geometric structures 18 formed within the block. In certain examples, the block 16 is formed from a plurality of stacked layers, and more specifically the plurality of stacked layers are integrated to form the block and the plurality of nano-photonic geometric structures. Geometric structures define the topology of the structured dielectric material and therefore define regions within the block that are characterized by material properties of the dielectric material including properties such as refractive index and density. For example, geometric structures can define boundaries for transition from a first refractive index to a second refractive index, and geometric structures can form patterns of differentiated refractive index that split broadband light into wavelength ranges with near-field focus compared to existing splitters and with much less attenuation than existing filters.

An incident electromagnetic radiation that is cast upon or received by the block is split into a plurality of substantially parallel beams of spectrally distinct electromagnetic wavelength ranges by transmission through the plurality of nano-photonic geometric structures.

The block has an input surface 20 for receiving the incident electromagnetic radiation and an output surface 22 for transmitting the plurality of substantially parallel beams of spectrally distinct electromagnetic wavelength ranges. Since the geometric structure topology at the input surface may provide regions of solid and void depending on a specific implementation, the input surface may be considered a plane defined by a side of the block configured for receiving incident electromagnetic radiation, and therefore terms input surface and input plane may be used interchangeably. Since the geometric structure topology at the output surface may provide regions of solid and void depending on a specific implementation, the output surface may be considered a plane defined by a side of the block configured for transmitting a plurality of beams of spectrally distinct electromagnetic wavelength ranges to an opposing pixel configured photo-detector array, and therefore terms output surface and output plane may be used interchangeably.

The assessment of the substantially parallel characteristic of the beams is intended to occur at the output surface of the block, and not a distance from or remote to the output surface. By substantially parallel is meant that the angular deviation of the plurality of beams at the output surface can typically be constrained within a 20 degree angular range and more typically within a 15 degree angular range and often within a 10 degree angular range. The substantially parallel characteristic can be demonstrated in a test case of the incident electromagnetic radiation received at a normal (ie., perpendicular) angle to the input surface that then corresponds to the plurality of substantially parallel beams of spectrally distinct electromagnetic wavelength ranges transmitted at the splitter output surface at an angular range of less than 10 degrees from the normal angle to the output surface. In the test case of normal angled incident radiation, an insignificant portion of the plurality of beams at the output surface may occur as angular outliers outside of the intended angular range of less than 10 degrees from the normal angle to the output surface (ie., a cone shape profile defined by a 10 degree projection from normal, where normal is the central axis of the cone), but the bulk of the plurality of beams will fall within the intended angular range, as even with a conservative estimate (ie., a 3 layer splitter which provides better performance than a filter, but is not expected to perform to the level of splitters with many more layers, such as 10 layer, 20 layer, 30 layer or 40 layer splitters) at least 80% of power is within an angular range of less than 10 degrees from the normal angle to the output surface and at least 90% of power is within an angular range of less than 14 degrees from the normal angle to the output surface. It is to be understood that an angle referenced to the normal angle of the output surface may project in any direction such that the total angular distribution profile is contained within a cone of the specified angle. The test case may be extended to off-normal incident radiation, and incident radiation received at an angular range of normal+/−10 degrees relative to the input surface, would correspond to a conservative estimate of at least 80% of power within an angular range of less than 10 degrees from the same angle as the incident angle transposed to the output surface (ie., incident angle maintained at the output surface as the reference angle for the angular range) for the plurality of beams at the output surface.

The plurality of nano-photonic geometric structures is distributed throughout the block from the input surface to the output surface, and the input surface and the output surface are independently communicative with the plurality of nano-photonic geometric structures. By independently communicative is meant that the input and output surfaces may communicate with a same continuous geometric structure or different discontinuous geometric structures or combinations thereof, and that communication of the input surface with geometric structures can occur independently of communication of the output surface with geometric structures. Therefore, in certain examples the input surface may communicate with a first group of the plurality of nano-photonic geometric structures and the output surface may communicate with a second group of geometric structures, where the first and second groups are structurally separated and discontinuous, while in further examples both the input surface and output surface may communicate with a third group of nano-photonic geometric structures that continuously extend from the input surface to the output surface.

The image sensor operates with the dielectric splitter located proximal to a pixel configured photo-detector array. The pixel configured photo-detector array provides an active layer surface 24 that receives the plurality of substantially parallel beams of spectrally distinct electromagnetic wavelength ranges that are transmitted from the output surface 22 of the block.

The active layer surface 24 is oriented parallel to and in facing opposition to the output surface of the block without need for any intervening artificial or synthesized component, although insertion of an intervening artificial or synthesized component is not prohibited. Separation between the active layer surface 24 and the output surface 22 of the block can be minimized, and a separation of the active layer surface 24 and the output surface 22 will typically be less than 500 nanometers (nm). For example, a separation of the active layer surface and the output surface can be less than 400 nanometers.

The active layer surface can be considered as spanning all of the individual photodiode active areas in a photo-detector array. Accordingly, active layer and active area may be used interchangeably as the active layer is simply an accumulation of all active areas in a photo-detector array that lie on a common plane. The term active area is well recognized in photodiode implementations, and is understood to be a defined area within a photodiode that can receive and convert photons into current.

Each beam of the plurality of beams of spectrally distinct electromagnetic wavelength ranges need not be separated without overlap and often may not avoid overlap as most imaging sensors function with three or four distinct wavelength ranges and some overlap becomes likely with splitters providing three or more wavelength ranges. Therefore, the plurality of beams of spectrally distinct electromagnetic wavelength ranges will provide at least a first set of beams and a second set of beams where a peak intensity of the wavelength range of the first set of beams occurs at a different wavelength than a peak intensity of the wavelength range of the second set of beams. All beams within the first set of beams need not be the same wavelength range with variation tolerated, and similarly all beams within the second set of beams need not be the same wavelength range with variation tolerated. When considering all the beams in the first set of beams and all the beams in the second set of beams the combined wavelength range of the first set of beams is different than the combined wavelength range of the second set of beams, but overlap is tolerated. Typically, the overlap is minimized and typically the intensity of the wavelengths of the first or second set in the overlap accounts for less than 40% (in certain examples less than 35% or in other examples less than 30%) of the total intensity of the total wavelength range of the first set or the second set, respectively. Similar considerations apply when the plurality of beams of spectrally distinct electromagnetic wavelength ranges include three sets of beams or four sets of beams or an even greater number of beam sets. Spectrally distinct includes spectral separation with or without overlap, and therefore spectrally distinct encompasses the possibility of spectrally differentiated that provides separated wavelength ranges without overlap.

The image sensor has been found to have various beneficial characteristics. For example, the image sensor has been found to provide superior performance in accommodating variation in off-normal angles of incident electromagnetic radiation.

In another example of a beneficial characteristic, transmission efficiency of incident electromagnetic radiation is improved in that total intensity of the plurality of substantially parallel beams of spectrally distinct electromagnetic wavelength ranges transmitted from the splitter output surface is greater than 50% compared to a corresponding total intensity of the incident electromagnetic radiation received into and through the splitter input surface (into and through the splitter input surface is specified so as to exclude electromagnetic radiation that is reflected away from the splitter input surface). In other examples, transmission efficiency of greater than 60% may be achieved. In further examples, transmission efficiency of 70% may be achieved. The improvement in transmission efficiency can also be expressed as a reduced attenuation of incident electromagnetic radiation when compared to its corresponding plurality of substantially parallel beams of spectrally distinct electromagnetic wavelength ranges, where attenuation may be less than 50%, or less than 40%, or less than 30%.

In still another example of a beneficial characteristic, the splitter provides near-field focus in that focus of the plurality of substantially parallel beams of spectrally distinct electromagnetic wavelength ranges transmitted from the splitter output surface is characterized by a working distance of less than 500 nm relative to the output surface and a minimum focus distance of less than 300 nm relative to the output surface. By working distance is meant a normal (ie., perpendicular) distance between the splitter output surface and the active surface layer of the pixel configured photodetector array. By minimum focus distance is meant a minimum perpendicular distance required from the splitter output surface to achieve beam focus. The working distance may be greater than the minimum focus distance, but equivalency is also feasible. In a certain example, the working distance is less than 400 nm and the minimum focus distance is less than 200 nm, while in another example the working distance is less than 300 nm and the minimum focus distance is less than 100 nm. In a further example, the working distance is less than 200 nm and minimum focus distance is at zero or approximately zero (an example, of approximately zero is less than 20 nm, while another example of approximately zero is less than 10 nm).

In yet another example of a beneficial characteristic, the splitter provides angular conservation by maintaining an angle of incident radiation within a constrained distribution of beam angles at the output surface in that a test case of the incident electromagnetic radiation received at a normal (ie., perpendicular) angle to the input surface corresponds to the plurality of substantially parallel beams of spectrally distinct electromagnetic wavelength ranges transmitted from the splitter output surface at an angular range of less than 10 degrees from the normal angle to the output surface (ie., a cone shape profile defined by a 10 degree projection from normal, where normal is the central axis of the cone). The assessment of the angular range is intended to occur at the output surface of the block, and not a distance from or remote to the output surface. In another example, tested with a normal angled incident electromagnetic radiation, the corresponding plurality of substantially parallel beams of spectrally distinct electromagnetic wavelength ranges transmitted from the splitter output surface are in an angular range of less than 7 degrees from the normal angle to the output surface, while in other examples the angle of the beams relative to the output surface are in an angular range of less than 5 degrees from the normal angle to the output surface. In the test case of normal angled incident radiation, an insignificant portion of the plurality of beams may occur as angular outliers outside of an intended angular range of less than 10 degrees from the normal angle to the output surface (ie., a cone shape profile defined by a 10 degree projection from normal, where normal is the central axis of the cone), but the bulk of the plurality of beams will fall within the intended angular range, as even with a conservative estimate (ie., a 3 layer splitter which provides better performance than a filter, but is not expected to perform to the level of a comparable splitter with many more layers, such as 10 layer, 20 layer, 30 layer or 40 layer splitters) at least 80% of power is within an angular range of less than 10 degrees from the normal angle to the output surface and at least 90% of power is within an angular range of less than 14 degrees from the normal angle to the output surface. It is to be understood that an angle referenced to the normal angle of the output surface may project in any direction such that the total angular distribution profile is contained within a cone of the specified angle. The test case may be extended to off-normal incident radiation, and incident radiation received at an angular range of normal+/−10 degrees relative to the input surface, would correspond to a conservative estimate of at least 80% of power within an angular range of less than 10 degrees from the same angle as the incident angle transposed to the output surface (ie., incident angle maintained at the output surface as the reference angle for the angular range) for the plurality of beams at the output surface.

Figure 2:
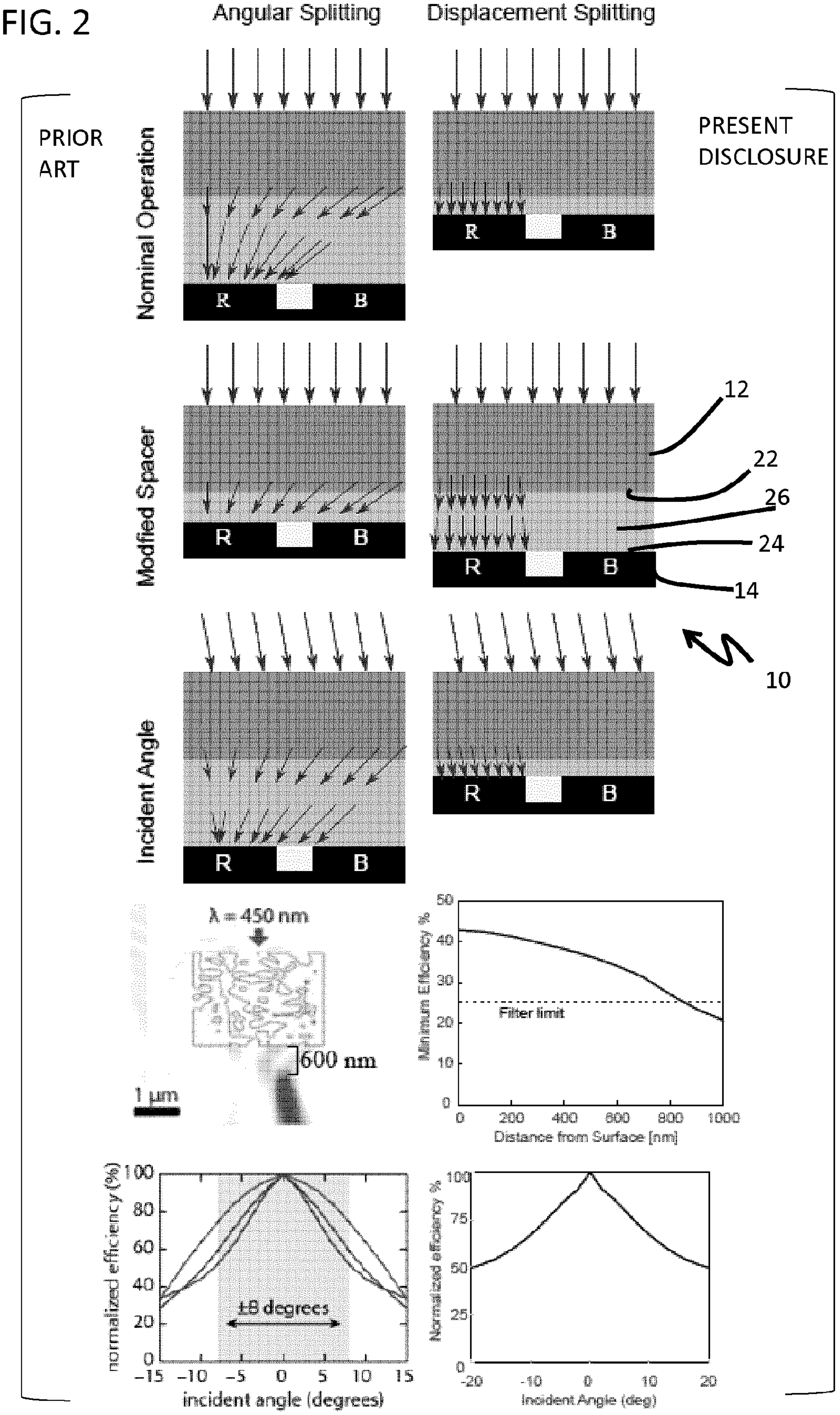
FIG. 2 shows multiple illustrative comparisons of the image sensor shown in FIG. 1 against a prior art image sensor with an angular splitter.

FIG. 2 diagrammatically represents the near-field focus and angular conservation benefits of the image sensor in an implementation of a color image sensor, with the left column showing illustrations and data of a comparator image sensor incorporating an angular splitter and the right column showing illustrations and data of the image sensor 10 of the present disclosure that transmits substantially parallel beams from the output surface 22 of the splitter block 12. For convenience of illustration the diagrams are shown with a red wavelength incident light and only a red (R) and blue (B) pixel. The first row shows a diagram of nominal operation with the comparator requiring a relatively larger spacer 26 in between the output surface 22 and active layer surface 24. In the first row, both the comparator and the present image sensor 10 efficiently direct the incident light to the red pixel in the pixel configured photo-detector array. In the second row, the spacing is changed with all other elements remaining the same as shown in the first row. In the second row, the spacing of the comparator is reduced and spacing of the present image sensor 10 is increased. As a result, the red light is not focused to the red pixel in the comparator since the spacer is less than the specific distance requirement to focus a beam from the output surface of an angular splitter, while due to the substantially parallel beam output of the present splitter the increased dimension of the spacer (relative to the first row depiction) is readily accommodated without altering focused transmission of the red light to the red pixel. Thus, the advantages of near-field focus and angular conservation of the image sensor 10 of the present disclosure underly a further advantage of accommodating variation in the spacing of the output surface 22 and active layer surface 24. In the third row, the angle of the incident red light is changed with all other elements remaining the same as shown in the first row. The comparator with the angular splitter is compromised due to poor angular conservation, while the present image sensor can accommodate the change in incident angle due to the angular conservation benefit of the present splitter. The fourth row shows that the minimum focus distance for the angular splitter is about 600 nm, while the present splitter has a minimum focus distance of approximately zero and does not significantly reduce efficient focused transmission until about 200 nm and from about 200 nm to about 800 nm the efficiency is steadily reduced but still remains higher than a convetional color absorptive filter. The fifth row graphically presents data showing that the splitter of the present disclosure is better able to accommodate changes in incident angle than the comparator angular splitter.

Figure 3:
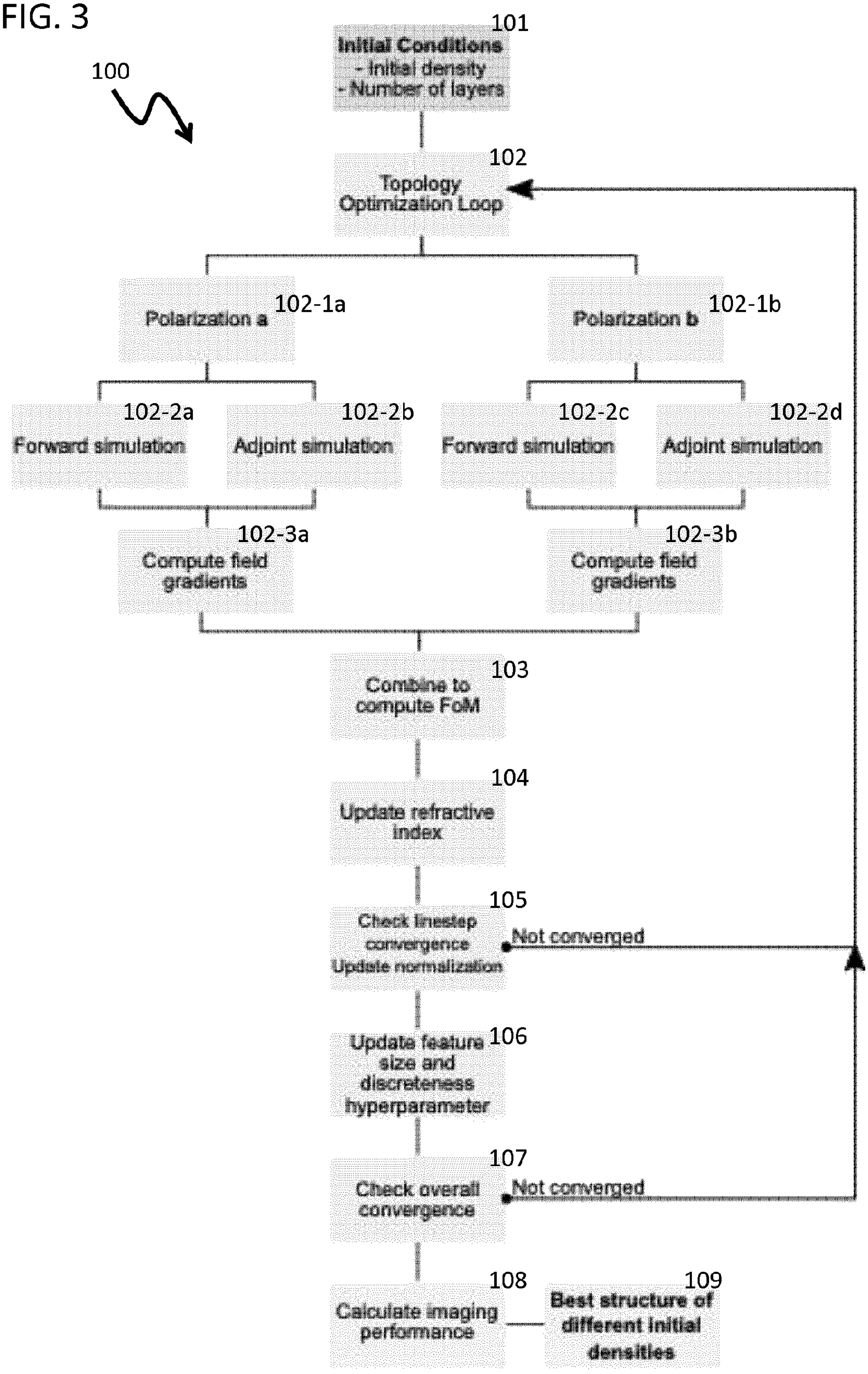
FIG. 3 shows an example of an adjoint-based inverse design process for configuring the splitter shown in FIG. 1.

FIG. 3 shows an illustration of an inverse design flow process 100 that can be used to configure the splitter 12. An illustrative example, of four stacked layers of dielectric material integrated to form the splitter 12 and its free form topology of geometric structures for a color (red/green/blue) imaging implementation is described with reference to inverse design process steps shown in FIG. 3.

Step 101—Setup of initial conditions. The optimization begins by selecting the initial density and number of layers. Without loss of generality, parameters assumed for this illustrative example are four stacked layers for this structure, a structure material with refractive index n=1.5 (glass-like photoresist) and a background refractive index of n=1 (air), and a working distance of 0 (the output surface of the splitter structure is directly on top and abutting against the photo-detector array active layer surface). For structures with splitting behavior dominated by spatial displacement (as opposed to angular redistribution) that can output substantially parallel beams, a working distance of less than the mean wavelength of light in the background medium should be selected.

For any optimization it is beneficial to run multiple values for the initial relative density of the structure, which can be varied between 0 (equal to the background index, n=1 here) and 1 (equal to the structure index, n=1.5 here). Because the optimization is inherently local, different initial conditions lead to different performance levels at the end of the optimization. More complex figures of merit (including non-differentiable functions, such as taking the minimum of the three color performances) can additionally be used at the end of the optimization to compare results of the varying initial conditions as well. Specifications concerning minimum radius of curvature, binarization thresholds, maximum step sizes for example are set as well, but generally have smaller influence on the final result than the initial structure guess.

Step 102—Topology optimization loop. The topology optimization works to perturb the refractive index of the initial guess material to increase the figure of merit. This occurs in three sub-steps.

Step 102-1-*a/b*—Polarizations. Each of the two cardinal polarizations (102-1*a*, 102-1*b*) are run separately to allow results for randomly polarized light to be obtained. These can run concurrently as they are independent. The calculations consist of two simulations: forward and adjoint simulation shown in Step 102-2.

Step 102-2-*a/b/c/d*—Forward and Adjoint Simulation. Two simulations are run for each polarization: the forward simulation (102-2*a* and 102-2*c*) corresponds to a plane wave being launched toward the structure, and the adjoint simulation (102-2*b* and 102-2*d*) driving three sources from the sensor pixel locations. Here, three discrete dipole sources are utilized, one at the center of each pixel region, and with dipole spectra corresponding to the target spectra of the pixel at which it is located. Single dipoles can be utilized that match the polarization of the forward simulation. Dipole sources assume an ideal light distribution centered at the center of each pixel, although multiple dipole sources may be utilized to allow for (or specifically target) more distributed light intensity profile. This approach allows all three colors to be run in a single simulation, as they are spectrally distinct. The use of single dipoles for each pixel further benefits the optimization maintaining the incoming angle of light at exit from the splitter structure, a benefit allowed by spatial displacement.

Step 102-3-*a/b*—Gradient calculation. The electric field values in the splitter region from the forward and adjoint simulation are combined to determine the field gradient (102-3*a*, 102-3*b*) at each spatial point, and for each color band, with the performance within each spectral band being averaged. This provides a four-dimensional (three spatial dimensions and one spectral dimension) array of the field gradients. For layered structures, such as the four-layer structure discussed here, the performance within each layer region is averaged to reduce the number of points in the layer direction to the number of layers (here, four). Here, equal layer thicknesses are utilized, but any other thickness combination, or thicknesses that are allowed to adapt to minimize the divergence of the gradients within each layer are possible to further optimize the performance of layered structure, or to better conform to fabrication requirements (e.g. thinner upper layers for sequential nanoimprint lithography).

Step 103—Figure of merit calculation. The figure of merit determines the degree to which the optimization has moved forward successfully (how much the adjustment from the previous change in permittivity improved performance). This is used by the optimizer to determine the magnitude of subsequent adjustments. Here, the figure of merit is calculated based on the electric field intensity at the central point of each pixel in the forward simulation (the same point as the dipole source is located in the adjoint simulation). The field intensity is averaged for the two polarizations. The three color values are then averaged with weighting factors based on the performance of the previous iteration, increasing weight on under-performing colors and decreasing weight on the higher performing colors. For the working distance=0 used in the example here, this calculation corresponds to determining the spatial displacement of the three color bands into the appropriate pixels. This importantly contrasts to previous work that does not consider the spatial distribution of light at the exit of the splitter structure, but on the focusing behavior a significant distance (greater than the average wavelength of light, ~500 nm) away from the splitter structure.

Step 104—Update refractive index. The gradient in the refractive index with respect to the figure of merit is then calculated using the gradients of the fields from Step 102-3-*a/b* and the figure of merit from Step 103. The optimizer determines the overall scaling of the change in the refractive index, with the relative changes determined by the field gradients and color band weightings from the figure of merit. These result in the density of the material being increased or decreased at each point in the splitter design region, within the allowed range of [0:1].

Step 105—Linestep convergence check. The optimizer utilized here takes multiple steps before changing step sizes (which control how the calculated gradients are converted into changes in refractive index), and so it determined if either the gradients have fallen below a minimum threshold or if the change in the figure of merit is smaller than a given threshold. If not, the next iteration proceeds as normal; if so, step sizes are reduced and the topology optimization loop continues. We utilize this time to update our color normalization values to allow for re-weighting of the coefficients that increase weight on low performing colors and decrease weight on those that are already performing relatively better. This allows the optimization to ensure all colors perform sufficiently well, without adding non-differentiable functions to the figure of merit itself. These coefficients modify both the figure of merit, and the gradients to ensure self-consistency between iterations.

Step 106—Update structure parameters. If the linestep convergence is complete, parameters controlling the strictness of the enforcement minimum feature size and binarization are updated by the optimizer. The optimization loop then begins again, while resetting the linestep parameters (while also allowing for a reduction in the figure of merit to be accepted due to the increased requirements on the binarization and feature sizes).

Step 107—Overall convergence. Once the optimization loop converges with the binarization threshold at a target value, the optimization is considered fully converged, and proceeds to the next step.

Step 108—Imaging performance calculation. A matrix inverse process is employed to calculate the color imaging efficiency, with the overall performance limited by the lowest performing of the three color bands. This allows a single value to be computed as to the efficiency of the splitter. This is calculated for the final optimized structure.

Step 109—Comparison of the initial condition ensemble. The imaging performance of the ensemble of initial conditions optimized through the process above can then be compared. Because the initial conditions can lead to significantly different performance in the splitters, comparisons of the minimum and mean performance of the color band can be useful. Additional constraints may also be tested, such as further limitation of feature sizes, fabrication robustness (invariance to vertical displacement, dilation/contraction, or misalignment), operation at additional incident angles, etc. This allows selection of a single structure to be utilized for the color splitter design. Determining performance across a range of angles of incident light in particular is highly important for real imaging applications. We find that a small working distance (namely=0) allows for superior performance in this important metric. Without wishing to be bound by theory, this is likely due to the change in the basic principle by which light is separated for small or large working distances, with small distances requiring spatial displacement of the focused field distribution with little change in the angular distribution; while larger distances can rely almost entirely on changes in the angular distribution exiting the color splitter to be later focused onto the imaging plane. The lack of a reliance on a specific angular distribution for small working distances thus increases the resilience of the performance to off-normal angles of incoming light.

The splitter and its use in an image sensor has been validated by experimental testing with regard to a three color (red/green/blue) image sensor implementation. Experimental testing results demonstrate the ability of the splitter to efficiently generate and direct beams of spectrally distinct wavelength ranges to a pixel configured photo-detector array. The following experimental examples are for illustration purposes only and are not intended to be a limiting description.

Experimental Example: Background

Color imaging is most commonly achieved through absorptive Bayer filter arrays (depicted in FIG. 4*a*), with each of three color pixel filters allowing ⅓ of the incident light to transmit to the active material below (Bayer, 1976). While this allows high selectivity of individual colors and thus simple image processing, the significant losses are becoming an increasing issue, particularly as the trend toward smaller, higher resolution sensors further reduces the incoming average photon count per pixel.

Figure 4:
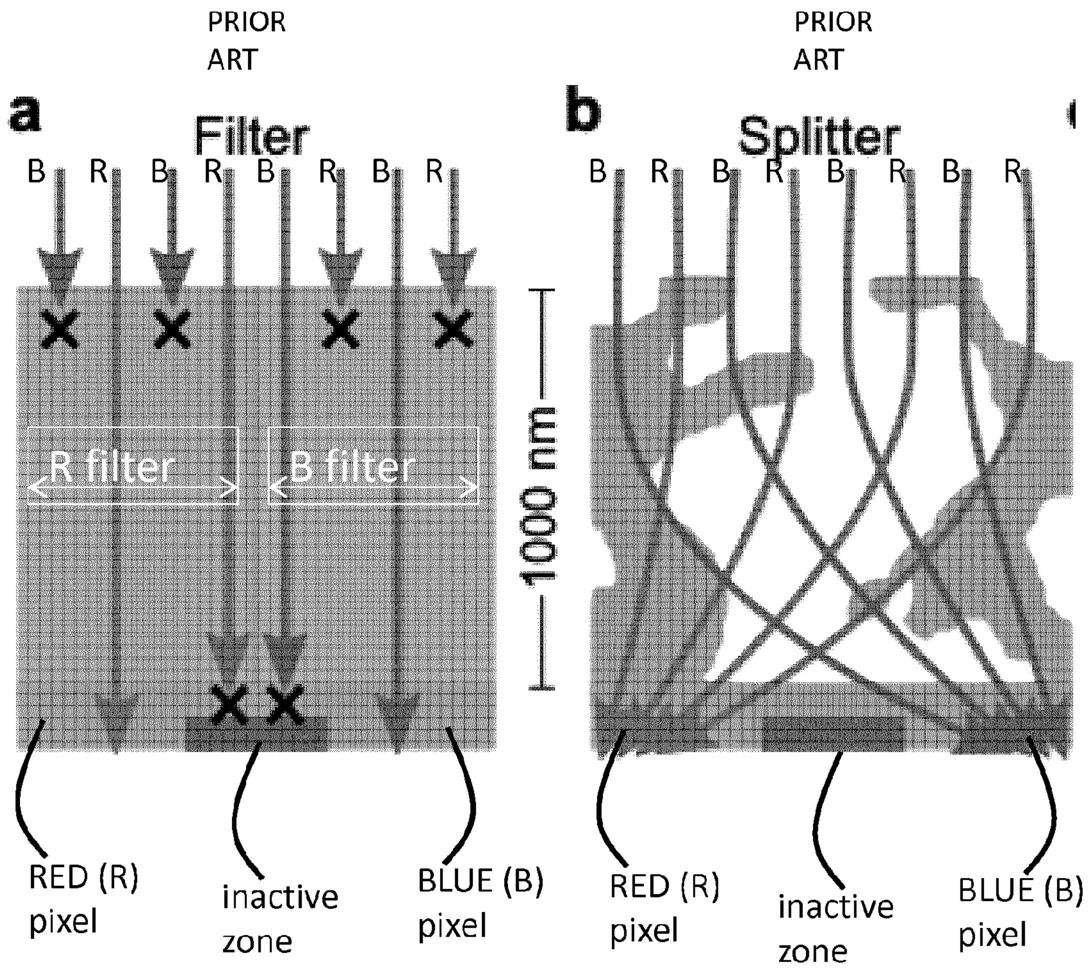
FIG. 4 shows an example of a prior art Bayer filter (FIG. 4*a*) and an example of a prior art angular splitter (FIG. 4*b*).

An alternative approach to filtering is splitting the incident light by color, redirecting the appropriate wavelength range to a corresponding pixel (FIG. 4*b*). Theoretically, this can increase the photon collection on average by 3×, with additional improvements possible for front-illuminated CMOS configurations (where often only 50% of the illuminated surface is photoactive) (Zhang et al., 2010), due to built-in lensing/funneling (Sounas and Alu, 2016; Johlin et al., 2018). Color splitting for imaging applications has been investigated previously through fairly complex processes (Chen et al., 2016), often involving high-refractive-index material processing steps (Sounas and Alu, 2016; Miyata et al., 2019; Chen et al., 2017; Nishiwaki et al., 2013; Tamang et al., 2019; Zhao et al., 2020), new elements in the far-field of the sensor (Miyata et al., 2019; Chen et al., 2017; Nishiwaki et al., 2013; Xiao et al., 2016; Camayd-Muñoz et al., 2020), and computationally expensive image reconstructions (Wang and Menon, 2015; Sahoo et al., 2017). Many designs additionally only work with a specific polarization of light, limiting their efficiency for normal imaging applications (Xu et al., 2010; Nguyen-Huu et al., 2011; Kanamori et al., 2006). Furthermore, as sensors now regularly feature pixel sizes down to 800 nm in pitch (Sony Corporation, 2018), color splitters need to be capable of handling this high pixel density as well, which to our knowledge has not yet previously been achieved, with many existing designs being 10×-100× larger (Davis et al., 2017; Wang and Menon, 2015; Chen et al., 2017).

In essence, there are three competing objectives for either color splitters or filters: selectivity, transmissivity, and simplicity. Filters excel at selectivity and simplicity, but with low transmissivity, while splitters usually sacrifice simplicity and selectivity for increased transmissivity. While selectivity can to some degree be compensated for via processing (Wang and Menon, 2015; Hauser et al., 2019), so far the need for multiple additional materials, as well as precisely aligned additional layers away from the sensor surface have precluded wide adoption of color splitters for compact sensing.

In this work we computationally explore the design process and performance of fully dielectric, low-refractive-index (less than 2) nanophotonic color splitters for imaging applications, with the splitter element printed directly on the surface (and thus in the near-field) of the active material layer. This would thereby allow these novel splitters to serve as simple drop-in replacements for the current absorptive filters, while significantly increasing the sensor transmissivity. Specifically, we investigate components containing a range of geometric complexity, from single-layer 2D patterns (producible through simple single-step photolithography) to fully 3D structures (fabricable through multi-photon lithography (Deubel et al. 2004), or holography (Yuan and Herman 2016)). In all cases we consider only a single low index (n=1.5) dielectric material, printed directly on top of a CMOS sensor, which to our knowledge has not been investigated previously. We observe up to 2.0× improvements in photon collection efficiency even after rigorous (but computationally trivial) color correction, accompanied by the option to increase collection by 2.4× in grayscale imaging (e.g. for low-light imaging, night vision) on the same sensor.

Experimental Example: Results

Figure 5:
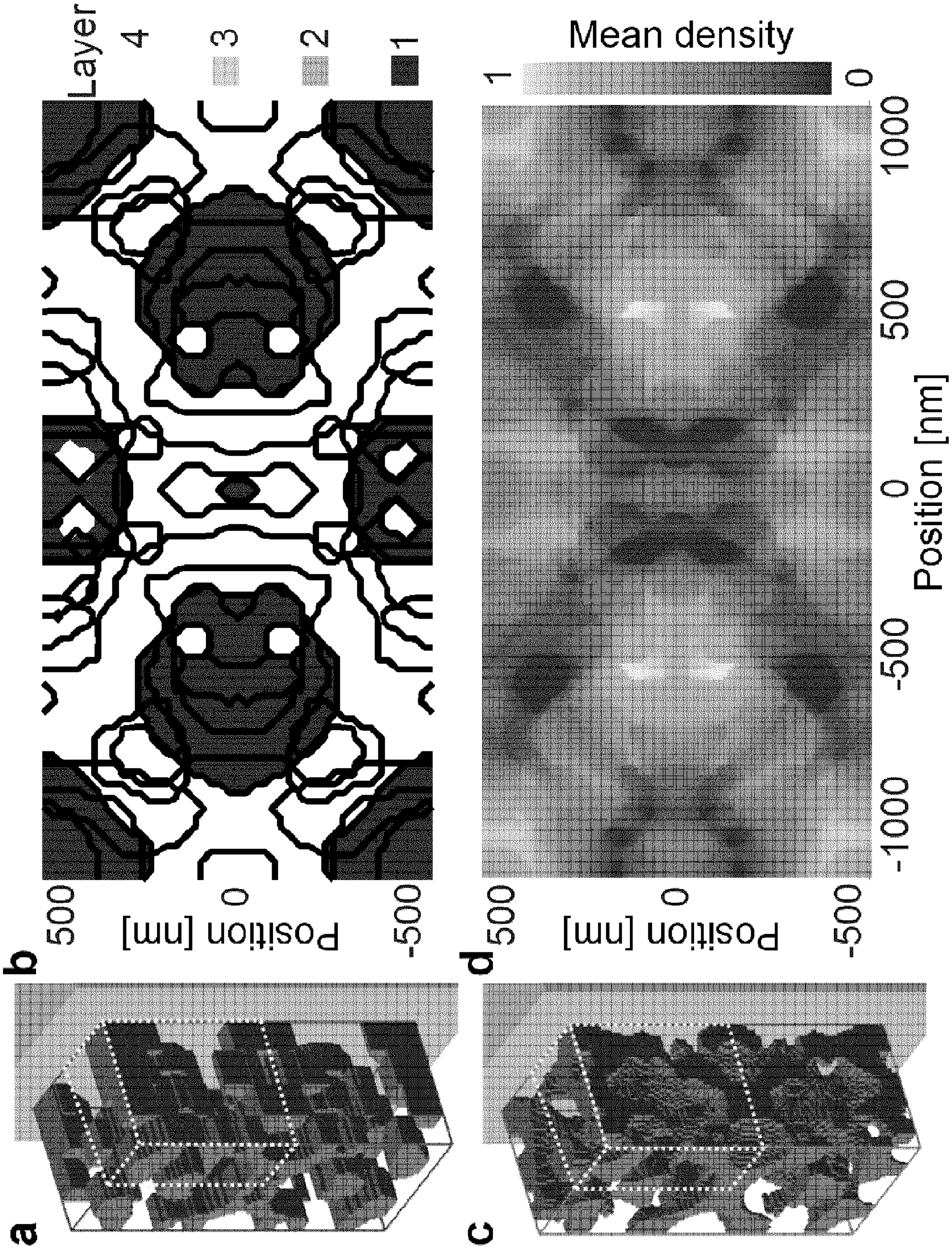
FIG. 5. Color splitter designs.

Splitter Design. The general philosophy of this work is to utilize adjoint-based inverse design to determine structures that succeed at splitting broadband, randomly polarized light into a pixel array, based on three distinct wavelength bands: 400-500 nm (blue), 500-600 nm (green), and 600-700 nm (red). We investigate structures of varying complexity, from single layer (fully 2D; metasurface) coatings, to four-layer (4×2D) coatings (FIG. 5*a*, 5*b*), producible through one to four standard photolithography steps respectively, to fully 3D photonic-crystal-like structures (FIG. 5*c*, 5*d*).

We utilize a two-step process for the overall design of the splitter geometry: First, topology optimization using a simple figure of merit is run for a range of initial conditions, returning a locally-optimal structure for each provided starting point. This is followed by a more accurate analysis of the final designs, using a color-corrected efficiency metric to determine the single best structure those generated by the various initial conditions. The process for each of the steps follows, with additional details in the Supporting Information.

Topology Optimization. Adjoint-based inverse design is an efficient method for nanophotonic topology optimization (Rodriguez et al. 2018). This works by leveraging properly configured forward and reverse (adjoint) simulations to compute gradients of a figure of merit with respect to discrete changes in structural permittivity. By iterating this process, one can converge on a locally-optimal solution to a figure of merit, given the initial conditions. This approach has been used widely in nanoscale optics to design components ranging from optical resonators (Lu, Boyd, and Vučković 2011), to integrated photonic circuits (Lalau-Keraly et al. 2013; Elesin et al. 2014; Piggott et al. 2015), to metasurfaces able to perform computational tasks (Estakhri, Edwards, and Engheta 2019; Liu et al. 2018).

Here, we utilize inverse design to maximize the concentration of on-band (correctly colored) light in the center of the corresponding pixel. Pixel sizes are fixed at 800 nm to correspond to the highest resolution CMOS detectors commonly available today (Sony Corporation 2018), with an assumed active area fill-factor of 0.5, corresponding to 565 nm wide square active regions (Zhang et al. 2010). The optimization region total thickness was limited to 1000 nm, similar to the thickness of color filters (FUJIFILM Holdings, n.d.). The material being structured is taken to be purely dielectric with a refractive index of n=1.5 comparable to that of transparent photoresist, on a glass substrate of equivalent index, and with a background of air (n=1.0) on the front surface and any material-absent areas of the structured region.

Each optimization iteration step consists of four broadband finite-difference time-domain (FDTD) simulations, corresponding to the two orthogonal light polarizations, each with one forward and one adjoint simulation. By orienting the simulation coordinate system diagonally with respect to the sensor layout, we can exploit the system symmetry, requiring only ¼ of the splitter region to be actively simulated. For the 800 nm pixel size, the active simulation area thus has dimensions of 565×1130 nm.

The optimization figure of merit (FoM) is the function that the optimization takes gradients of to determine the evolution of the structure permittivity, and thus geometry. While ideally the final color-corrected response (discussed below) would be used for the optimization, such an equation is not differentiable making the computation of gradients impossible. To address this, we use a simplified FoM for the optimization, corresponding to the intensity of the electric field of on-band light ($|E|^2$) in the center of each color pixel immediately below the splitter surface, from broadband planewave illumination in the forward simulation. This corresponds to a simple adjoint simulation as well, corresponding to a single dipole emitter of the proper emission frequency again at the center of each pixel, scaled by the electric field from the forward simulation. This follows the general method of field localization optimization described in (Miller, 2012), and is coincidentally similar to method used by the concurrent work in (Camayd-Muñoz et al., 2020).

As adjoint-based topology optimizations are local optimization techniques, the choice of initial conditions have a significant impact on the resulting design and performance. For each layer complexity, a series of optimizations was run, ranging from fully filled to fully empty along with 9 equally-spaced uniform index levels between as the starting point for the optimization. This allows us to utilize a full color-corrected efficiency calculation to compare the 11 resulting structures for each configuration, and select those with the best overall performance. See the Supporting Information for additional details and flowchart of the optimization and simulation process.

Color-corrected efficiency. At the most basic level, a color splitter could be operated similar to a color filter, attenuating the incoming light to the point where the off-band color response (e.g. red light into the blue pixel region) is sufficiently low, and then determining the transmission efficiency of the on-band color response. However, since the signal from four single-color pixels are combined to create one RGB image pixel, one can use the correlations between the pixels to determine more accurately the colors in the image. This allows color selectivity to be improved, although still at a cost of some transmissivity. We here describe a general method for evaluating the overall color imaging efficiency using a simple matrix inversion process, applicable to any color isolating component (splitter or filter).

We begin by creating a 3×3 matrix, R of the color response, with rows corresponding to the red, green, and blue pixels, and columns being the average red, green, and blue color transmission into the respective pixel. In a theoretically perfect splitter, R would be the identity matrix, but in any real design there will be some degree of off-color transmission represented by non-zero off-diagonal elements. The inverse of the response matrix represents the linear combination of the pixel responses that would recover the identity matrix (I) and thus the ideal response, by using combinations of the color pixels to effectively cancel out the off-band responses. However, in order to avoid amplification of noise, the value of any element in the inverse matrix must be limited to 1 (ie., we allow signal attenuation but not gain). Furthermore, the total performance of the system will be ultimately limited by the response of the worst-performing color-corrected element, and so the response must be uniformly scaled. We thus normalize the inverse matrix by the largest element in said matrix, thereby providing the gain-free color-correction matrix, Q, as $$Q = \frac{(R^{-1})}{\max[|R^{-1}|]}. \quad \text{(Eq. 1)}$$

The color-corrected response to a uniform input is thus RQ, and is equal to $\eta I$, where $\eta$ is the overall color-corrected efficiency.

It should be noted that while matrix inversion is often a computationally expensive process, the small 3×3 size of these response matrices, and the need for this to be performed only once during the splitter design phase makes the color correction process computationally trivial-during actual imaging, the correction is simply a uniform linear combination of the sensor's red, green, and blue signals.

Figure 6:
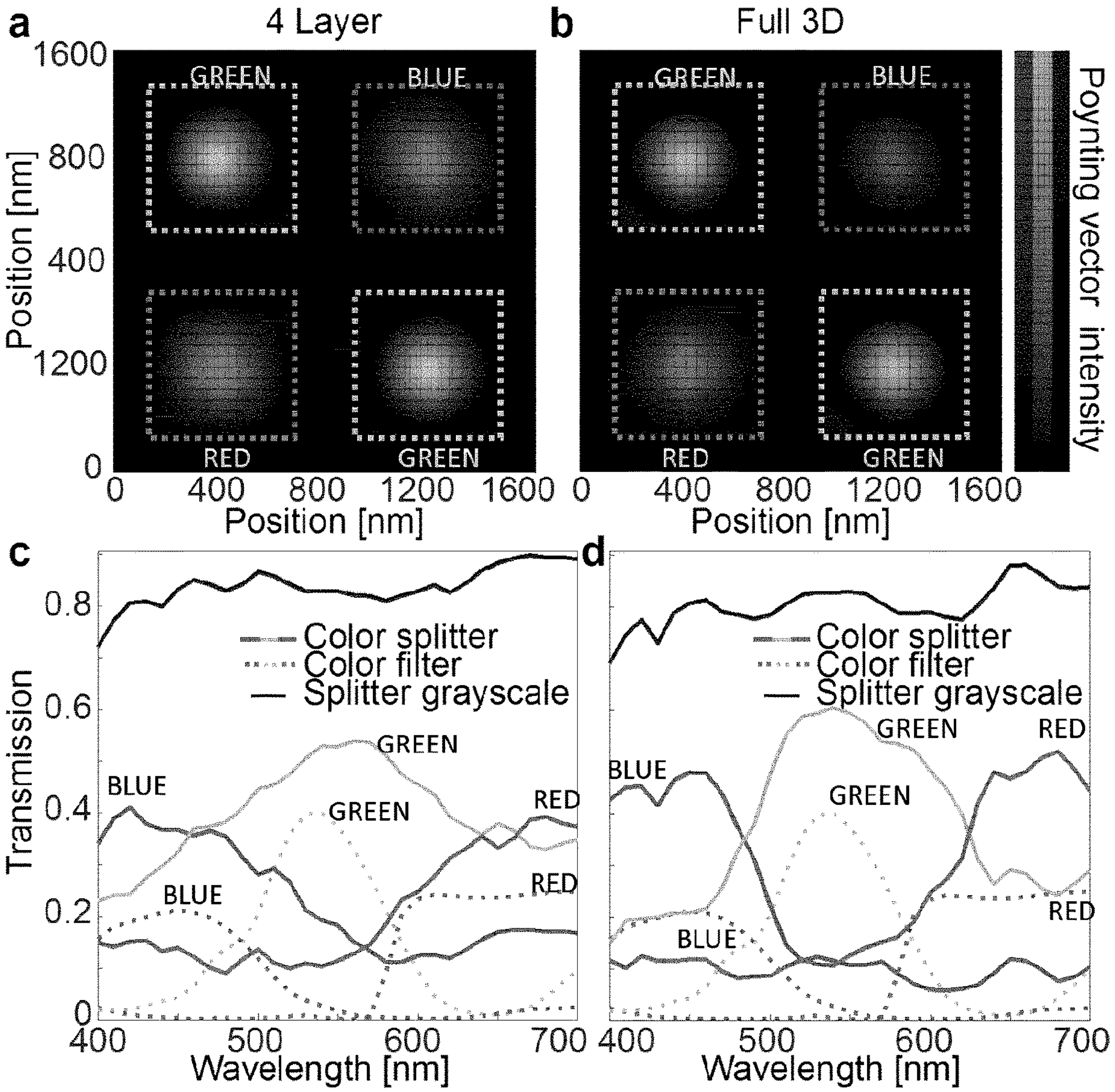
FIG. 6. Splitter operation.

Performance of splitters. The highest splitter performance was achieved by the fully 3D structures. The structure is portrayed in FIGS. 5*c* and 5*d*, and the color response is shown in FIG. 6, with the Poynting vector components normal to the substrate at surface (representing the flux of energy) depicted in FIG. 6*b*. It can be seen that all three colors are not only spatially isolated, but well focused into the center of the active region of the corresponding pixel, even without the need for micro-lens arrays. The four-layer structure (shown in FIGS. 5*a* and 5*b*) appears similar in spatial power transmission (FIG. 6*a*), still showing strong spectrally selective focusing of light onto the sensor surface. The selectivity, however, is slightly lower, particularly for the green pixel, as seen in FIG. 6*c*.

The simulated transmission spectrum is shown in FIGS. 6*c* and 6*d* for four-layer and 3D splitters respectively, and are compared to that of a representative commercial Bayer filter absorptive layers (FUJIFILM Holdings, n.d.). It is observed that each color component of collection efficiency is higher than that of absorptive filters, indicating that light is successfully rerouted into the correct filter region. This is likely occurring through a combination of refractive and interference effects, allowing efficient broadband responses to be created in the near-field of the sensor (Johlin et al. 2018). It also can be noted that while the collection efficiency is much higher, the selectivity is lower. However, as discussed above, this can be compensated for using linear combinations of the color pixel readings via Eq. 1 to produce the final fully color-corrected image, at a cost of some sensitivity. Our estimated efficiency of the 3D color splitter is 34% for fully color-corrected imaging, and 81% for grayscale imaging. This is compared to the Bayer filter, with color-corrected estimated efficiency of 17%, and grayscale efficiency of 33%.

Interestingly, the color separation mechanism of the splitters investigated herein appears to be distinct from those largely studied previously; the proximity of the color splitting structure prevents the use of angular redistribution to spectrally separate the light, (Nishiwaki et al. 2013) relying instead on full spatial separation at the base of the splitter, with little redistribution in angular-space of the transmitted light. This provides additional benefits as well, in that the splitters designed here appear to perform better at off-angle illumination than previous designs that rely more on scattering or diffraction to reconfigure the angular distribution from the splitter (Camayd-Muñoz et al. 2020). For more characterization of these effects, see Supporting Information.

Figure 7:
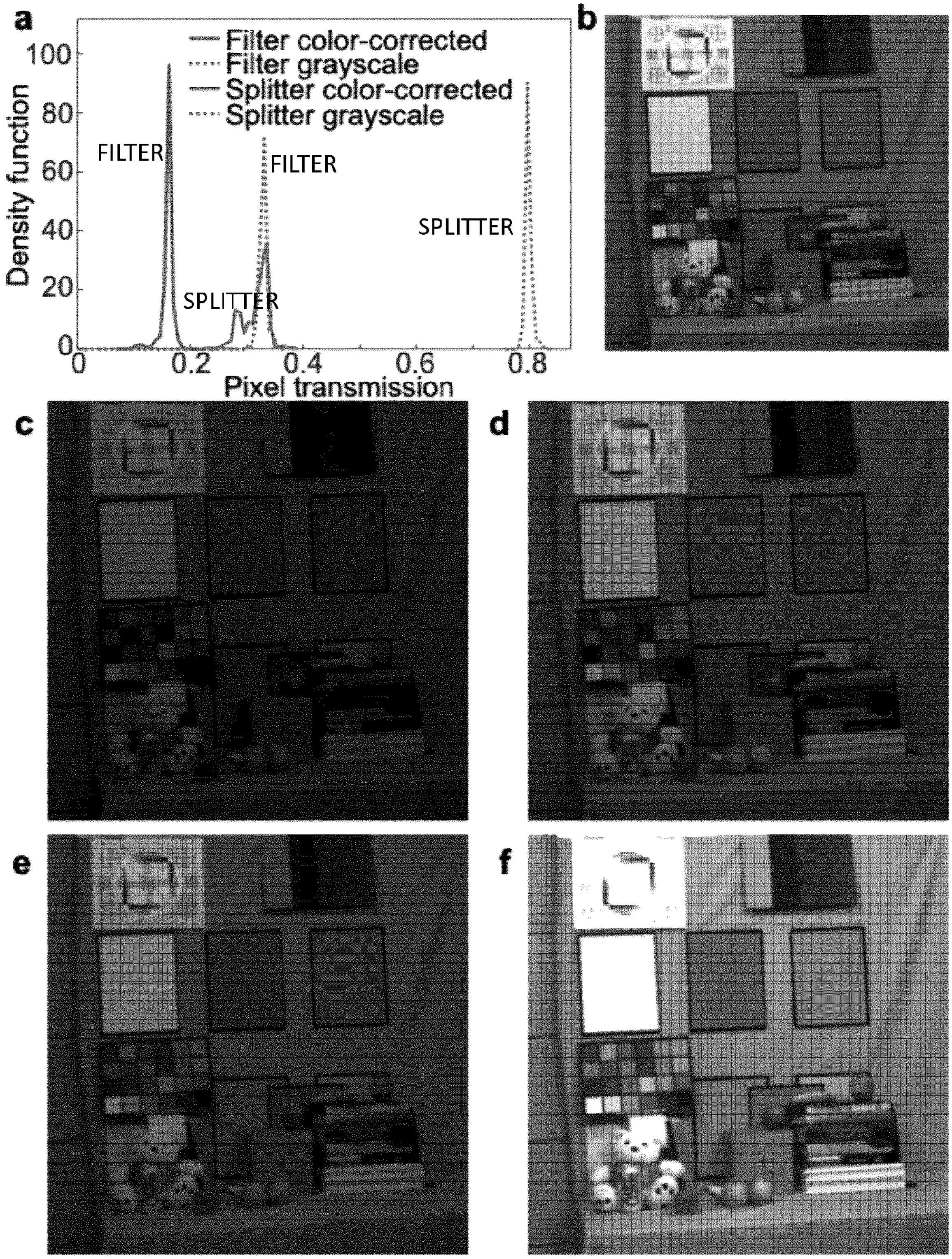
FIG. 7. Simulated imaging response.

Simulated full-color imaging. In order to validate the accuracy of the color correction, as well as visualize the increased sensitivity, it is instructive to directly compare the performance of the two sensor designs (Bayer filter vs. splitter) on realistic images. To do this, we use freely available 2000×2000 pixel hyperspectral images (Brainard, D. H. 2004) to simulate the operation of both the 3D color splitter, as well as the Bayer array for comparison. Through convolution of the per-pixel spectrum, first with a light source spectrum (the AM 1.5 sunlight spectrum is used here), followed by our color responses, and finally applying the linear color correction operation from Eq. 1, we obtain the expected full-color image response for each design. A reference image with 50% efficiency and perfect color separation is shown in FIG. 7*b*, along with the responses of filters and splitters after color correction, as well as in grayscale imaging.

By comparing the color-corrected response of the filter (FIG. 4*c*) and splitter (FIG. 4*d*) to the reference image, the splitters accurately reproduce the true colors, and with higher brightness than the standard Bayer filter. This is increasingly visible in the grayscale images (FIG. 4*e*,4*f*), where the splitter even surpasses the brightness of the 50% efficiency reference image. From the imaging efficiency distributions in FIG. 4*a*, we can see that indeed in color imaging the collection efficiency is increased by a factor of 2.0, from 15.9% for the Bayer filter to 31.3% for the color splitter, and with the grayscale efficiency increasing by a factor of 2.4, from 33% to 80.0%. The difference in performance from the estimated efficiency arises the non-uniform color distribution of the reference image, responsible for the extended distribution in the splitter color distribution as well.

Furthermore, the above comparisons all conservatively assume perfect micro-lens structures above the Bayer filter array, being both lossless and focusing all transmitted light into the active region. Without micro-lens arrays, the Bayer filter efficiency would be reduced by an additional factor of 2, with imperfect lenses somewhere in between. The splitters require no such micro-lens arrays, as they inherently focus the light into the active regions already.

It should be noted that the color correction used here is strict, in that all cross-color response must be eliminated. This is why even the Bayer filters, which have some color contamination, particularly in the green pixel response, show reduced efficiency when corrected as well. By limiting the strictness of this correction, any position on the trade-off continuum from no color correction to full color correction can be selected, and so for lower color contrast, increasing efficiencies can be realized.

Complexity and robustness. Reducing the layer complexity by an order of magnitude to just four discrete layers (structure shown in FIGS. 5_a_ and 5_b_), still maintains much of the performance of the color splitters. In fully color-corrected imaging, an efficiency of 21% is obtained, still notably higher than filters, especially when compared to filters without micro-lens arrays. In grayscale imaging, performance is even slightly higher than full 3D splitters, at 83%. With two layers (FIG. 8_c_), or even just a single layer (FIG. 8_b_), splitters are still able to produce full-color images, although at a fairly low efficiency. As expected, they maintain high grayscale performance, still without the need for any micro-lens array.

Figure 8:
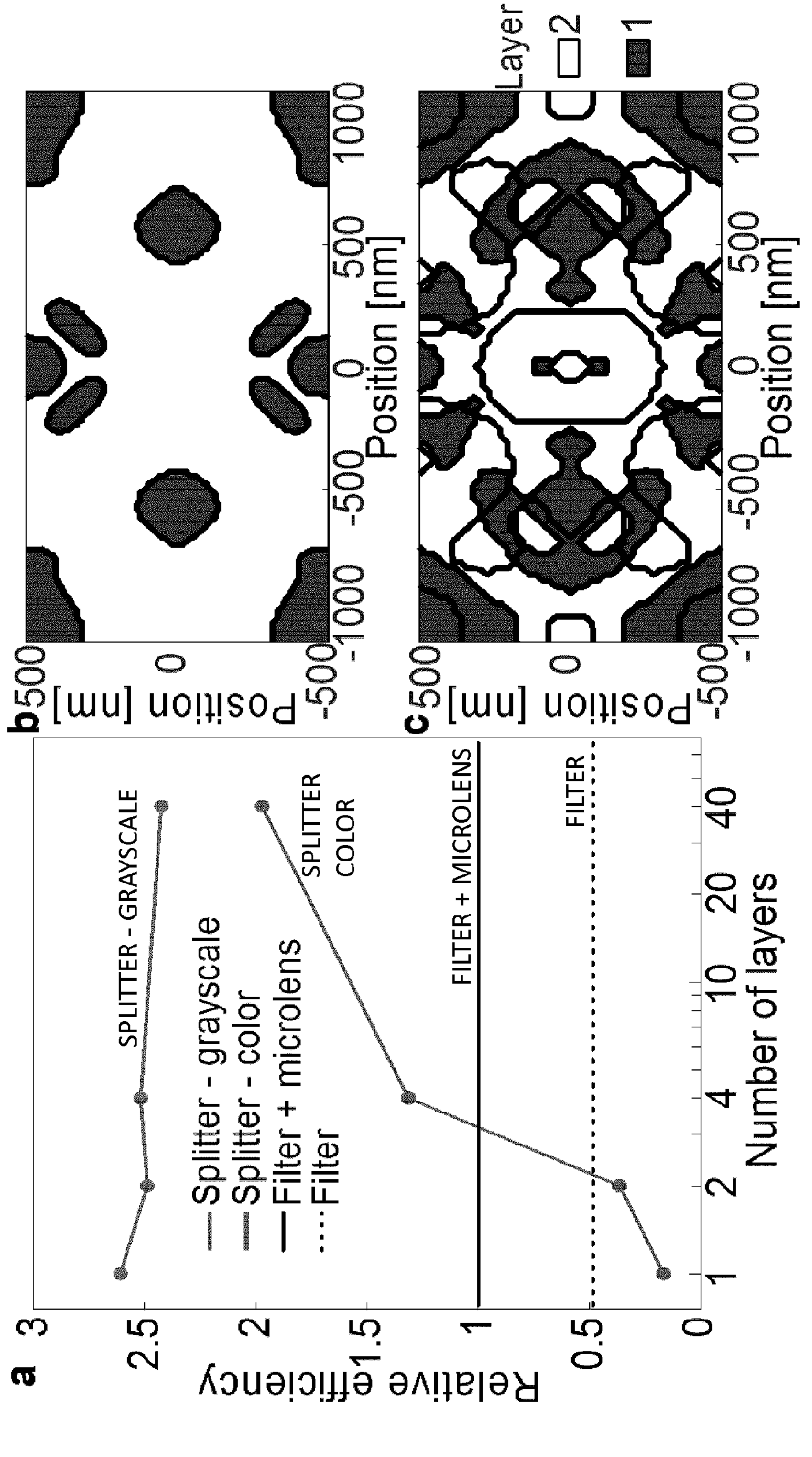
FIG. 8. Performance vs. complexity tradeoff.

This trend in performance vs. complexity is further clarified in FIG. 8_a_, showing the simulated color-corrected imaging efficiency with respect to the number of splitter layers. It should be noted that fully 3D structures here are equivalent to 40-layer structures due to the finite optimization voxel size. In particular the large gain in performance between two- and four-layer configurations is clearly visible, with the imaging efficiency moving from below the filter performance, to substantially above. This leap in performance indicates that the distinct layers spectrally separate light as it moves through the splitter, and demonstrating that the changes in structure topology (as splitter thickness is constant for ease of comparison of results of this Experimental Example) progressively separates and focuses the three color bands. Further characterization of one- and two-layer splitter structures is shown in the Supporting Information.

Finally, in order for such color splitters to be usable in real devices, robustness against both defects and non-ideal operating conditions should be ensured. Due to the broadband response of the splitters, performance should be generally invariant to minor (uniform) expansion or contraction of the structure. Furthermore, the strong focusing within the active regions of the pixels allows some built-in robustness to misalignment. While all analysis here assumes randomly polarized light, we additionally ensure that such splitters perform well in arbitrary linear polarizations, as well as for non-normal incident light, as is common in normal imaging systems. See Supporting Information for further discussion of these effects.

Experimental Example; Demonstrated Advantage

Herein we have shown that efficient color splitters can be designed using low-index dielectric layered 2D or fully 3D structures directly on the surface of CMOS sensors. Performance significantly surpasses that of traditional filter arrays for splitter designs even with as few as four layers, with efficiency enhancements as high as 4 times over CMOS sensors without micro-lens arrays. Splitter structures show added functionality in the ability to chose any point in the color accuracy vs. sensitivity trade-off, permitting accurate color imaging, nearly lossless grayscale imaging, and anything in between, all on the same sensor. This could offer particular advantages in color biological imaging, where high efficiency, small pixel sizes, and color sensitivity are all desired (Wu et al. 2008; Farsiu et al. 2004). Furthermore, these splitter structures do not require any focusing micro-lens arrays, even when used with 800 nm pixel CMOS sensor configurations with active area fractions of 50%, further simplifying the use of such components.

The placement of the splitter in the near-field of the sensor surface offers unique benefits over previous color splitter configurations as well, both in design and performance. Removing the need for precise yet thick separation layers can simplify fabrication, and operating without angular redistribution of light transmitted to the sensor surface appears to provide increased invariance to off-normal illumination conditions, and may also reduce losses and cross-talk in sensor as well. (Zhang et al. 2010).

Finally, the color-corrected efficiency metric developed for the splitter design process here is general, and should be useful in comparing the performance of new splitter or filter structures as well. A similar design and analysis approach could additionally be utilized for other applications, such as infrared imaging or photovoltaics, especially where splitting and focusing are both advantageous (Xiao et al. 2016).

Experimental Example: Supplemental Information

Inverse Design. Inverse design is performed through topology optimization using a modified version of the Lumopt package (Lalau-Keraly et al. 2013). Broadband (400-700 nm wavelength) simulations are utilized to exploit the efficiency of FDTD techniques with large spectral ranges, and to preclude the need for an additional simulation for each wavelength range. Ideally, under broadband, planewave illumination, all light of each wavelength range would be perfectly focused onto the center of the corresponding pixel, with no spectral overlap between pixels. This is represented in the optimization by the forward (400-700 nm planewave illumination) and adjoint (3× dipoles, each with a 80 nm wavelength range centered in the 100 nm color band to reduce spectral overlap, located at the pixel center) simulations.

Full 3D optimizations allow each volume element of the predefined structure region to be independently modified. For 2D and layered structures, the spatial gradients are averaged in the direction orthogonal to the 2D design plane, allowing the mean performance in the optimization region to determine the direction of the optimization. Optimization are performed using a limited-memory Broyden-Fletcher-Goldfarb-Shanno algorithm with bound constraints (L-BFGS-B), as implemented in Scipy (Van Der Walt, Colbert, and Varoquaux 2011). The software utilizes built-in hyperparameters to converge both the binarization of the permittivity (begins with continuous values of permittivity, and moves to either material present or absent) as well as maximum radius of curvature of the structures (set to 100 nm to be compatible with 3D nano-lithography) (Johlin et al. 2018; Deubel et al. 2004). The optimization finishes with a binarization threshold of 99%, and gradients at a relative magnitude of $10^{-4}$.

Each color pixel provides it's own value of the figure of merit (FoM), with the total simply corresponding to the sum of the three color components. The minimum is not used as again, the FoM operation must be differentiable for the optimization to correctly compute gradients. However, it is still important to bias the optimization toward improving the worst-performing color pixel. To do so, between line-search steps in the optimization (at the same time that penalty functions for discreetness and curvature are implemented) a uniform linear weighting, equal to the reciprocal of the individual color performances from the previous optimization round, is applied to each of the three color components.

This allows the increased weighting of the lower performing color components without introducing errors in the gradient computations.

Layer complexities of one-, two-, and four-layer structures, and fully 3D structures (equivalent to 40 layers due to the 25 nm pixel size) were individually optimized. Layered structures do not enforce minimum feature size limitations between layers.

Simulations. Simulations are performed using FDTD Solutions (Lumerical Inc.) Optimization is done using a mesh size of 25 nm in all directions in the optimization region, and 31 equally-spaced wavelength points. The optimization region sits immediately on top of a glass substrate, with the figure of merit measured at one grid point below the surface.

The forward simulation uses the magnitude of the electric field at the center of the pixel as the figure of merit. After optimization, final structures are simulated at a higher resolution grid of 10 nm, and fully binarized to ensure no gradient index material remains from the optimization.

Design Process Flowchart. A flowchart of the full inverse design process is shown in FIG. 3.

Lower-Complexity Structures. The structure of the lower-complexity one- and two-layer configurations are shown in FIG. 8*b* and FIG. 8*c*. The full thickness of all splitter configurations is fixed at 1000 nm, with the layers equally spaced within this domain. Here we further characterize these lower complexity structures.

Figure 9:
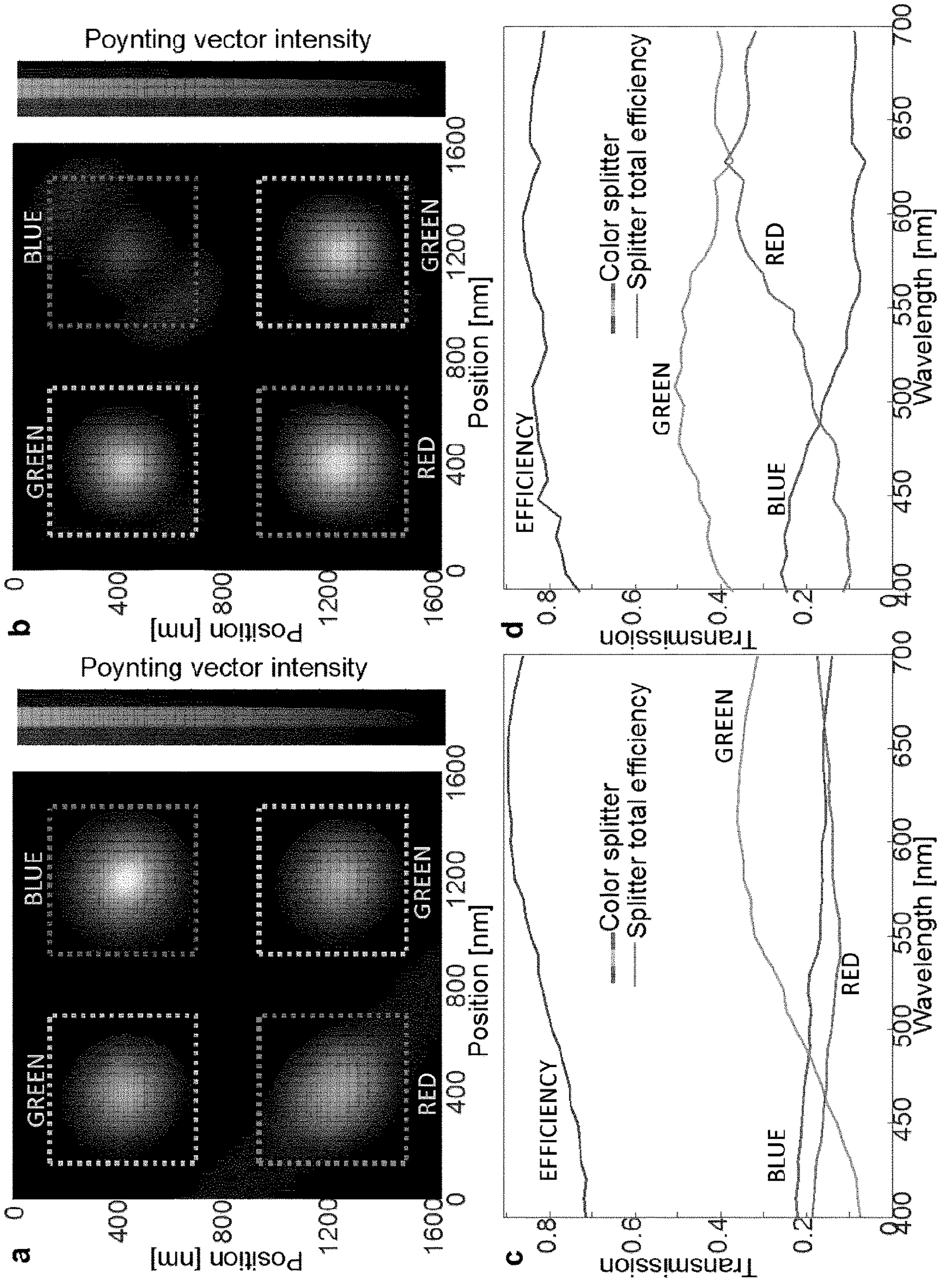
FIG. 9. Color splitter performance. Poynting vector intensity into the sensor surface, integrated over the three 100 nm color bands (blue-400-500 nm, green-500-600 nm, red-600-700 nm), for one- and two-layered structures (FIG. 9*a*, 9*b*, respectively). Integrated transmission into the corresponding color pixel active region, for one- and two-layered structures (FIG. 9*c*, 9*d*, respectively).

The optical responses of the lowest complexity single- and two-layer structures are displayed in FIG. 9. The Poynting vector images in FIGS. 9*a* and 9*b* show the enhanced color separation as layer complexity increases, visible through the increasingly pure color focus spot at the center of the pixel active regions. The transmission responses in FIGS. 9*c* and 9*d* similarly show improved color isolation with increasing number of layers, especially when moving to the four-layer design (FIG. 6*a*).

While single-layer structures provide very limited selectivity and contrast, the response of the different color pixels is still distinct enough to allow the color correction method to be employed, allowing color imaging (although at low sensitivity) with even these exceedingly simple structures. Moving to two layers improves this performance significantly, with trends in imaging performance shown in FIG. 8*a*.

Design Robustness. The broadband response of the structures designed here inherently provides some robustness to fabrication defects. Because of the scale invariance of Maxwell's equations, an overall dilation or contraction of the structures should result in simply a proportional shift in the color response. The broad responses, spanning 100 nm wavelength per color-band, suggest that such issues would be minimal.

Figure 10:
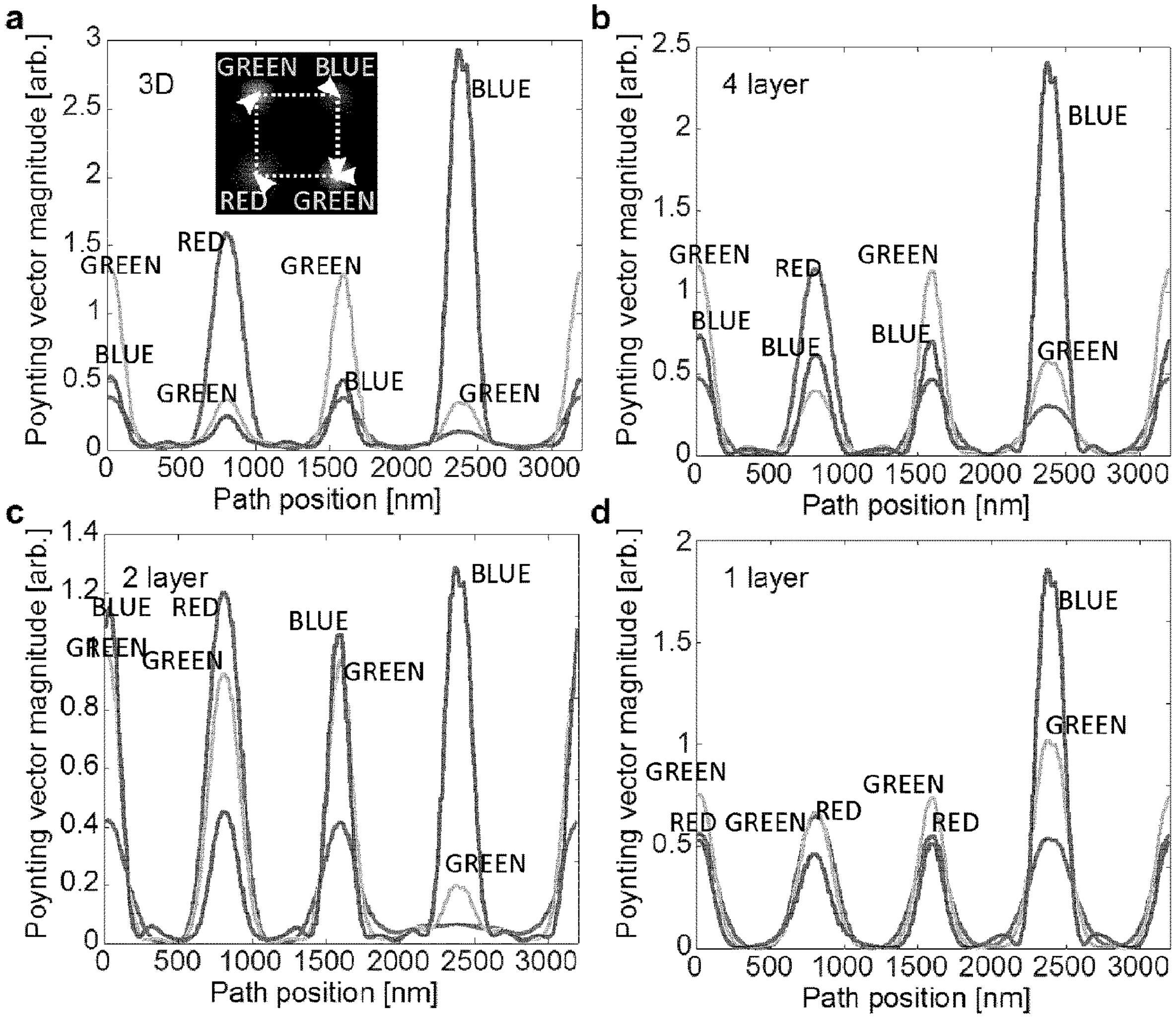
FIG. 10. Spatial distribution of power transmission. Path slices of the three color bands (blue, green and red lines) shown for one-, two-, and four-layer structures, as well as fully 3D structures, in FIGS. 10*a*, 10*b*, 10*c*, and 10*d*, respectively. The path taken by the line traces is shown inset in FIG. 10*a*.

Furthermore, the design is fairly robust against alignment issues as well; the plots of Poynting vector magnitude (the integral of which provides the power transmission; FIG. 9, and FIG. 6) demonstrate that slight misalignment of the array would still lead to the vast majority of power being centered in the corresponding pixel. This power concentration is further clarified in FIG. 10, where we observe that the transmission in each pixel is highly confined to the central region, with full-widths at half-max between 200 nm and 250 nm for the transmissions using the 3D structure.

In terms of sensitivity to misalignment, for the four-layer splitter for example, the red pixel (with the widest distribution of the three colors) still contains 97% of the collected light in a 400 nm diameter central region of the pixel, and 90% in the central 275 nm diameter. This suggests that even with a misalignment of 145 nm, collection efficiency should fall by less than 10%. If the fill-factor of the CMOS detector is greater than 0.5, this sensitivity is even more robust, allowing larger misalignment while maintaining high efficiency.

Angular Response. As light incident on a photodetector in any real imaging system is not perfectly columnated, the response of the system to non-normal incoming light is important to consider. Here we compute the expected angular response for incoming light with off-normal angles ranging from 0 to 20 degrees.

For specific angular responses, the metric of color imaging efficiency is not particularly meaningful; any real image pixel will receive a distribution of angles, and so the need to image entirely with a single angular response is unfeasible. This would thus produce a meaningless color-correction inversion matrix and imaging efficiency. Instead, we here calculate the sorting efficiency, defined as the fraction of on-band incoming light entering the correct active region. This allows the relative performance under increasingly non-normal incident light to be compared, as well as comparisons to be made to previous works employing a similar metric (although without a limited active sensor region) (Camayd-Muñoz et al. 2020).

Figure 11:
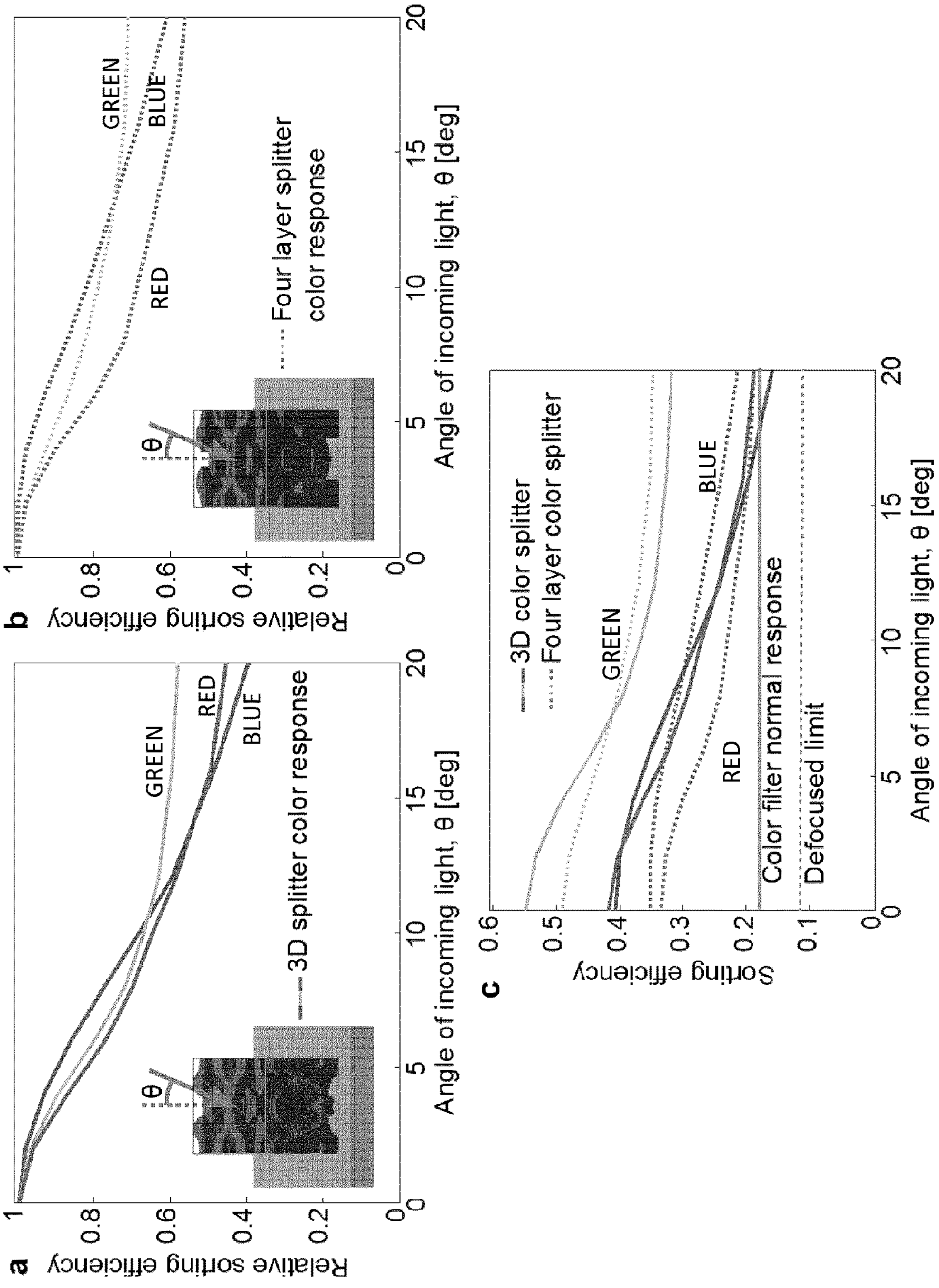
FIG. 11. Angular response of splitter structures. The relative sorting efficiencies for fully 3D as well as four-layer 2D structures with respect to the angle of incoming light, θ (depicted in the inset diagram) are shown in FIG. 11*a* and FIG. 11*b*, respectively. Absolute sorting efficiencies are shown in FIG. 11*c*, along with the corresponding limits for no focusing of light, as well as the limiting performance of color Bayer filters as the horizontal gray dashed and solid lines, respectively. The line colors (red, green, blue) correspond to the respective color pixels.

From FIG. 11 we can see the performance of the three color band responses (corresponding to the red, blue, and two green pixels), relative to their normal response. From FIG. 11*a*, it can be seen that performance will likely be limited by the red pixel response (for angles<12 degrees), but with a relative sorting efficiency still greater than 0.5. This compares positively to relative angular sorting efficiencies of previous color splitters which have utilized significant gaps between the splitter and sensor surface. (Camayd-Muñoz et al. 2020) This is likely indeed due to the increased proximity of the splitter to the sensor limits the displacement of the focal spot, and thereby reduces the harmful impact of non-normal incident light on the splitter performance.

Interestingly, the four-layer splitter structure in FIG. 11*b* shows even better relative angular performance, not falling below a 0.5 relative sorting efficiency, even for incoming light angles as high as 20 degrees. This indicates that in real imaging applications, the decreased performance between the fully 3D and layered 2D structures is reduced.

This is further elucidated in FIG. 11*c*, showing the absolute sorting efficiency of the two configurations. The limiting color response (red or blue, depending on angle and configuration) is still above even the normal-incidence limiting response of the perfectly focused color Bayer filter (sorting efficiency of 0.18 for blue pixels, from FIG. 6*c*, 6*d*), shown as the gray solid line for reference. Note that in reality, the assumption of perfectly ideal microlens arrays for the color filters will be further overly optimistic, meaning this response will in reality be significantly lower (and thus the splitters perform better by even a larger margin). Furthermore, particularly for the red and blue pixels, the active regions represent only 12.5% of the sensor surface, and so even at significant angles of incoming light, the emission is still being substantially focused into the correct region—the defocused limit (assuming all non-reflected light is spread evenly on the sensor) is shown as the dashed gray line.

Figure 12:
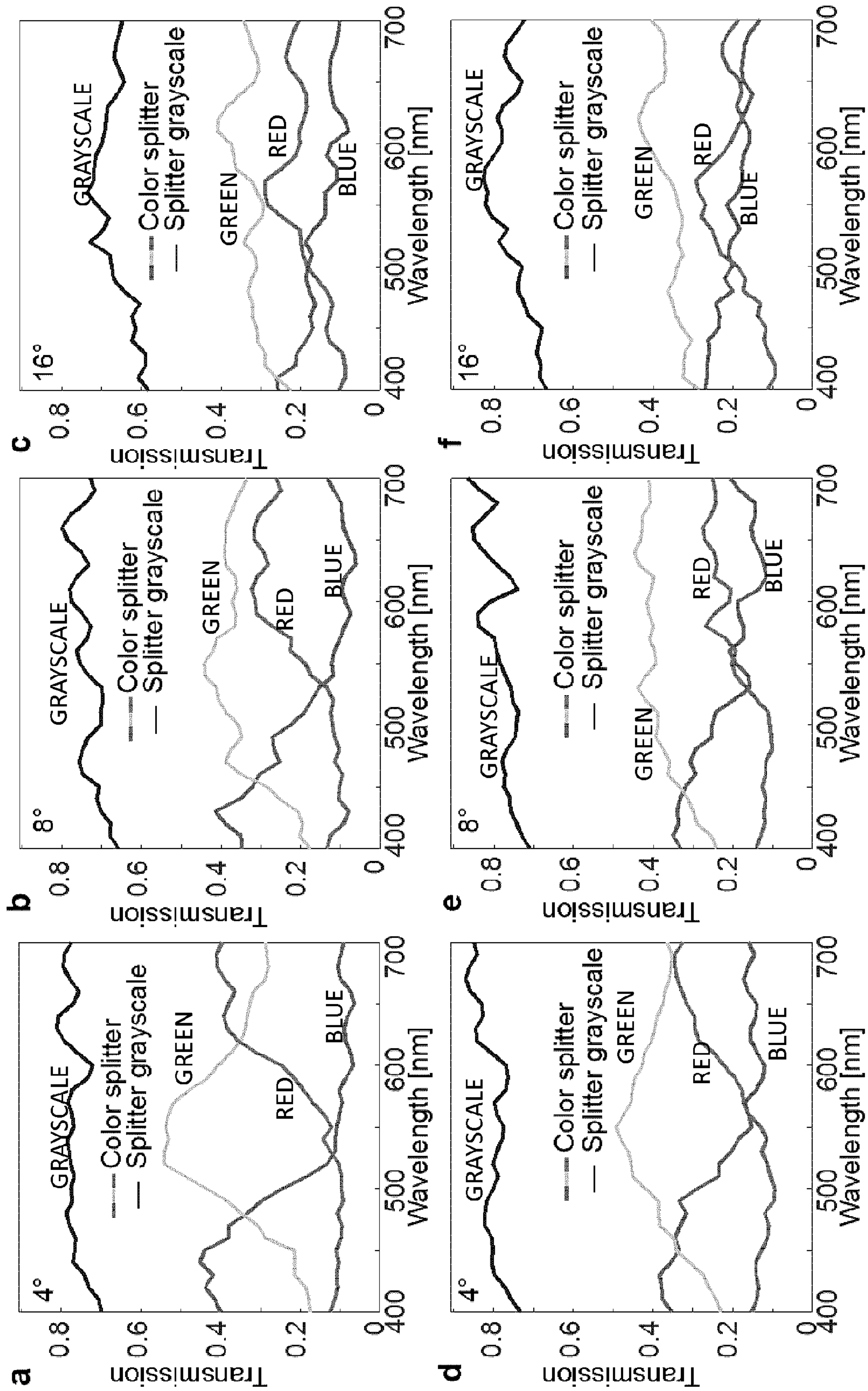
FIG. 12. Color transmission for off-normal incidence light. Transmission spectra into the three pixel color active regions, for fully 3D splitters are shown in FIG. 12*a*-12*c*, and for four-layer 2D structures in FIG. 12*d*-12*f*, for angles of 4 degrees, 8 degrees, and 16 degrees, corresponding to the angle θ as depicted inset in FIG. 11. Line colors (red, green, blue) correspond to the respective color pixels, and black lines represent overall grayscale efficiency (the sum of the three color components).

The transmission into the active regions for three off-normal angles are shown in FIG. 12, for both 3D (FIG. 12*a*-12*c*) and four-layer 2D structures (FIG. 12*d*-12*f*). It can be seen that while selectivity decreases as the angle of incoming light increases, even at 16 degrees incidence there is still some selectivity present. The total capture of light (grayscale transmission) is interestingly superior in the four-layer structure for high angle of incidence light, indicating that while spectral selectivity is decreased, the light focusing by the structures still is maintained. Even at an incoming angle of 16 degrees, over 75% of light is transmitted into the 0.5 fill-factor sensor regions. The ability of all structures to maintain high overall transmittance, even for significant angles of incoming light is likely due to the spatial separation of light at the base of these structures, in contrast to the angular separation (and reliance on multi-micrometer gaps) of those studied previously.

Figure 13:
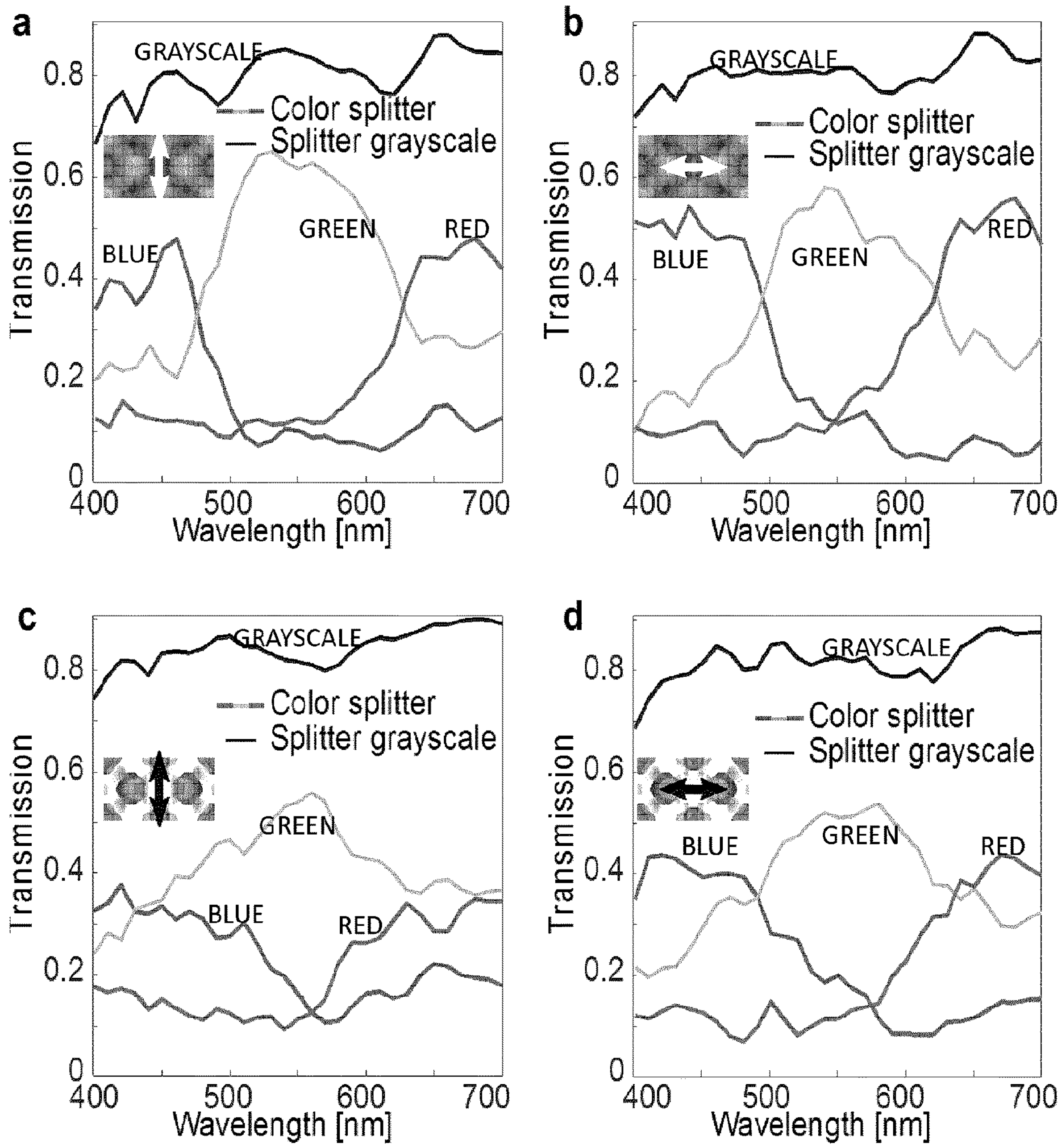
FIG. 13. Specific transmission for two orthogonal linearly polarizations of light are shown in FIG. 13*a* and FIG. 13*b* for fully 3D splitters, and FIG. 13*c* and FIG. 13*d* for four-layer 2D splitter structures. Line colors (red, green, blue) correspond to the respective color pixels, and black lines represent overall grayscale efficiency (the sum of the three color components). Electric field polarization relative to the splitter structure is shown inset in each plot.

Polarization Response. While all responses shown in the main text assume randomly polarized incoming light (i.e. a uniform distribution of polarization angles), in some cases there may be a significant degree of linear polarization of the incoming light, and then the polarization response of the splitter becomes important. In FIG. 13 we investigate the specific response of the two main splitter designs to two separate orthogonal linear polarizations of incoming light.

From FIGS. 13*a* and 13*b*, it can be seen that green response is slightly higher in FIG. 13*a*, red and blue are slightly higher in FIG. 13*b*, but the overall efficiency and contrast are largely similar between the two orthogonal conditions for the 3D splitter design. Specifically, the average sorting efficiency for polarization-a is 44%, and for polarization-b is 48%. Similarly in FIGS. 13*c* and 13*d*, there is a slight difference in efficiency of red and blue response, but again overall efficiency and contrast are similar, with average sorting efficiencies of 41% and 37% for polarization-a and polarization-b, respectively. This indicates that even in situations where imaging is performed with linearly polarized incoming light (even with arbitrary unknown polarization angle), efficient color imaging can be performed using the splitter structures.

Direction of Energy Transmission. The color splitters explored here are designed to be printed directly on a sensor surface (and thus in the near-field of the sensor), but there is potential for the transmitted energy to have significant off-normal angular components, particularly as light is collected from a large region and transmitted into a small focal area. While we only consider the contribution of Poynting vector components in the surface normal direction when analyzing the transmission of the color splitters, significant components in other directions could contribute to energy loss, and thereby decreased efficiency of the systems.

Figure 14:
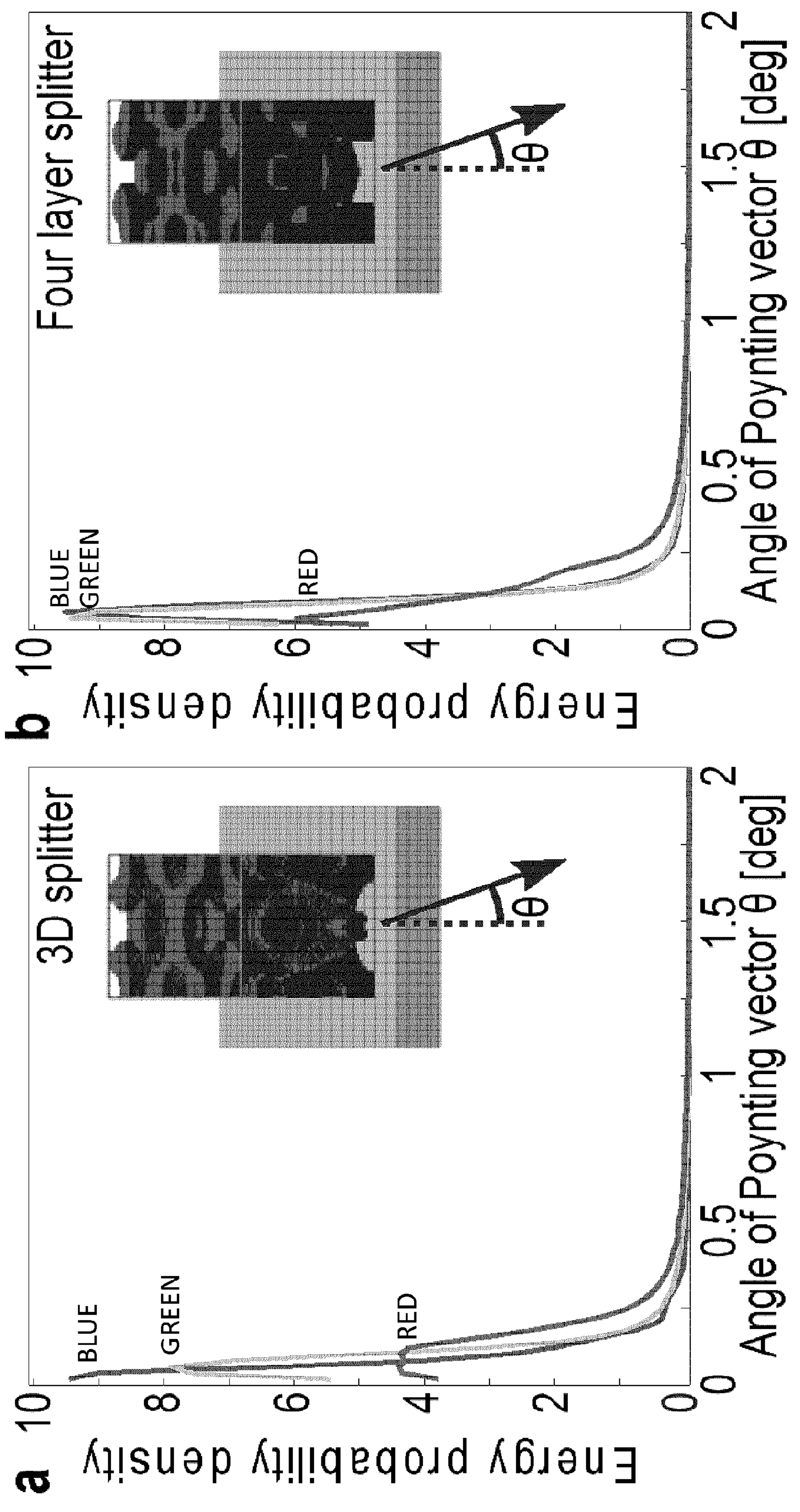
FIG. 14. Energy probability density functions of Poynting vector angles (θ) with respect to the sensor surface normal. Fully 3D splitter response is shown in FIG. 14*a*, while four-layer 2D structure response is shown in FIG. 14*b*. Probability densities are normalized so that they integrate to one. Line colors (red, green, blue) correspond to the respective color pixels region and color band included in the calculation.

In FIG. 14 we quantify these off-normal components, showing the energy probability density of the three light color bands for two splitter structures with respect to their angle from the surface normal. Each line indicates the probability density for different Poynting vector angles of the energy within the correct color band and pixel active area at the sensor surface. A delta function at zero would thus correspond to all energy propagating perfectly normal to the surface (equivalent to the planewave input), while the more extended the distribution, the higher prevalence of off-angle contributions to the energy at the surface of the sensor. In both FIGS. 14*a* and 14*b* (3D and four-layer splitters, respectively) it can be seen that for all three colors have extremely narrow distributions, with over 90% of energy contained at angles of less than 0.5 degrees. This fits well with the high performance observed in transmission of the splitter structures, as higher angle contributions would be seen as losses in our calculations. This also suggests that possibly including two red pixels (as opposed to two green pixels) would be more efficient for these designs, due to the increased difficulty in focusing and maintaining narrow angular transmission distributions of longer wavelength light.

The narrow angular distribution of these devices is also in direct contrast to the performance of previous splitter structures, which largely rely on diffractive (Nishiwaki et al. 2013) or scattering (Camayd-Muñoz et al. 2020) to intentionally redistribute different spectral bands of light into different angles to facilitate splitting. This indicates that the design of splitters directly the sensor surface does not only modify the configuration, but also preferences the design toward a different mechanism of operation as well.

Experimental Example: Reference List.

Bayer, Bryce E. 1976. "Color Imaging Array." (U.S. Pat. No. 3,971,065A).

Brainard, D. H. 2004. "Hyperspectral Image Data." http://color.psych.upenn.edu/hyperspectral/.

Camayd-Muñoz, Philip, Conner Ballew, Gregory Roberts, and Andrei Faraon. 2020. "Multifunctional Volumetric Meta-Optics for Color and Polarization Image Sensors." *Optica* 7 (4): 280-83.

Chen, Bo Han, Pin Chieh Wu, Vin-Cent Su, Yi-Chieh Lai, Cheng Hung Chu, I Chen Lee, Jia-Wern Chen, et al. 2017. "GaN Metalens for Pixel-Level Full-Color Routing at Visible Light." *Nano Letters* 17 (10): 6345-52.

Chen, Qin, Xin Hu, Long Wen, Yan Yu, and David R S Cumming. 2016. "Nanophotonic Image Sensors." *Small* 12 (36): 4922-35.

Davis, Matthew S, Wenqi Zhu, Ting Xu, Jay K Lee, Henri J Lezec, and Amit Agrawal. 2017. "Aperiodic Nanoplasmonic Devices for Directional Colour Filtering and Sensing." *Nature Communications* 8 (1): 1347.

Deubel, Markus, Georg Von Freymann, Martin Wegener, Suresh Pereira, Kurt Busch, and Costas M Soukoulis. 2004. "Direct Laser Writing of Three-Dimensional Photonic-Crystal Templates for Telecommunications." *Nature Materials* 3 (7): 444-47.

Elesin, Y., B. S. Lazarov, J. S. Jensen, and O. Sigmund. 2014. "Time domain topology optimization of 3D nanophotonic devices." *Photonics Nanostructures—Fundamentals and Applications* 12 (1): 23-33. https://doi.org/10.1016/j.photonics.2013.07.008.

Estakhri, Nasim Mohammadi, Brian Edwards, and Nader Engheta. 2019. "Inverse-designed metastructures that solve equations." Science 363 (6433): 1333-38. https://doi.org/10.1126/science.aaw2498.

Farsiu, Sina, Dirk Robinson, Michael Elad, and Peyman Milanfar. 2004. "Advances and Challenges in Super-Resolution." *International Journal of Imaging Systems and Technology* 14 (2): 47-57.

FUJIFILM Holdings. n.d. "RGB Primary Color Filters for Image Sensor Applications: 5th Generation COLOR MOSAIC." https://www.fujifilm.com/us/en/business/semiconductor-materials/image-sensor-color-mosaic/rgb/applications.

Hauser, Jonathan, Michael A Golub, Amir Averbuch, Menachem Nathan, Valery A Zheludev, Omer Inbar, and Shay Gurevitch. 2019. "High-Photon-Throughput Snapshot Colour Imaging Using a Monochromatic Digital Camera and a Pupil-Domain Diffuser." *Journal of Modern Optics* 66 (7): 710-25.

Johlin, Eric, Sander A Mann, Sachin Kasture, A Femius Koenderink, and Erik C Garnett. 2018. "Broadband Highly Directive 3d Nanophotonic Lenses." *Nature Communications* 9 (1): 1-8.

Kanamori, Yoshiaki, Masaya Shimono, and Kazuhiro Hane. 2006. "Fabrication of Transmission Color Filters Using Silicon Subwavelength Gratings on Quartz Substrates." *IEEE Photonics Technology Letters* 18 (20): 2126-28.

Lalau-Keraly, Christopher M., Samarth Bhargava, Owen D. Miller, and Eli Yablonovitch. 2013. "Adjoint shape optimization applied to electromagnetic design." *Optics Express* 21 (18): 21693. https://doi.org/10.1364/oe.21.021693

Liu, Dianjing, Yixuan Tan, Erfan Khoram, and Zongfu Yu. 2018. "Training Deep Neural Networks for the Inverse Design of Nanophotonic Structures." *ACS Photonics* 5 (4): 1365-69. https://doi.org/10.1021/acsphotonics.7b01377.

Lu, Jesse, Stephen Boyd, and Jelena Vučković. 2011. "Inverse design of a three-dimensional nanophotonic resonator." *Optics Express* 19 (11): 10563. https://doi.org/10.1364/OE.19.010563.

Miyata, Masashi, Mitsumasa Nakajima, and Toshikazu Hashimoto. 2019. "High-Sensitivity Color Imaging Using Pixel-Scale Color Splitters Based on Dielectric Metasurfaces." *ACS Photonics* 6 (6): 1442-50.

Nguyen-Huu, Nghia, Yu-Lung Lo, and Yu-Bin Chen. 2011. "Color Filters Featuring High Transmission Efficiency and Broad Bandwidth Based on Resonant Waveguide-Metallic Grating." *Optics Communications* 284 (10-11): 2473-79.

Nishiwaki, Seiji, Tatsuya Nakamura, Masao Hiramoto, Toshiya Fujii, and Masaaki Suzuki. 2013. "Efficient Colour Splitters for High-Pixel-Density Image Sensors." *Nature Photonics* 7 (3): 240.

Piggott, Alexander Y., Jesse Lu, Konstantinos G. Lagoudakis, Jan Petykiewicz, Thomas M. Babinec, and Jelena Vučković. 2015. "Inverse design and demonstration of a compact and broadband on-chip wavelength h demultiplexer." *Nature Photonics* 9 (June): 374-77. https://doi.org/10.1038/nphoton.2015.69.

Rodriguez, Alejandro W., Zin Lin, Jelena Vučković, Weiliang Jin, Sean Molesky, and Alexander Y. Piggott. 2018. "Inverse design in nanophotonics." *Nature Photonics* 12 (11): 659-70. https://doi.org/10.1038/s41566-018-0246-9.

Sahoo, Sujit Kumar, Dongliang Tang, and Cuong Dang. 2017. "Single-Shot Multispectral Imaging with a Monochromatic Camera." *Optica* 4 (10): 1209-13.

Sony Corporation. 2018. "Sony Releases Stacked CMOS Image Sensor for Smartphones with Industry's Highest 48 Effective Megapixels." https://www.sony.net/SonyInfo/News/Press/201807/18-060E/.

Sounas, Dimitrios L, and Andrea Alu. 2016. "Color Separation Through Spectrally-Selective Optical Funneling." *ACS Photonics* 3 (4): 620-26.

Tamang, Asman, Rion Parsons, Ujwol Palanchoke, Helmut Stiebig, Veit Wagner, Alberto Salleo, and Dietmar Knipp. 2019. "Color Sensing by Optical Antennas: Approaching the Quantum Efficiency Limit." *ACS Photonics* 6 (8): 2041-48.

Van Der Walt, S., Colbert, S.C., Varoquaux, G., 2011. The numpy array: a structure for efficient numerical computation. Computing in Science & Engineering 13, 22.

Wang, Peng, and Rajesh Menon. 2015. "Ultra-High-Sensitivity Color Imaging via a Transparent Diffractive-Filter Array and Computational Optics." *Optica* 2 (11): 933-39.

Wu, Changfeng, Barbara Bull, Craig Szymanski, Kenneth Christensen, and Jason McNeill. 2008. "Multicolor Conjugated Polymer Dots for Biological Fluorescence Imaging." *ACS Nano* 2 (11): 2415-23.

Xiao, T. Patrick, Osman S. Cifci, Samarth Bhargava, Hao Chen, Timo Gissibl, Weijun Zhou, Harald Giessen, Kimani C. Toussaint, Eli Yablonovitch, and Paul V. Braun. 2016. "Diffractive Spectral-Splitting Optical Element Designed by Adjoint-Based Electromagnetic Optimization and Fabricated by Femtosecond 3D Direct Laser Writing." *ACS Photonics* 3 (5): 886-94. https://doi.org/10.1021/acsphotonics.6b00066.

Xu, Ting, Yi-Kuei Wu, Xiangang Luo, and L Jay Guo. 2010. "Plasmonic Nanoresonators for High-Resolution Colour Filtering and Spectral Imaging." *Nature Communications* 1:59.

Yuan, Liang Leon, and Peter R Herman. 2016. "Laser Scanning Holographic Lithography for Flexible 3d Fabrication of Multi-Scale Integrated Nano-Structures and Optical Biosensors." *Scientific Reports* 6:22294.

Zhang, Fudi, Jianqi Zhang, Cui Yang, and Xiang Zhang. 2010. "Performance Simulation and Architecture Optimization for CMOS Image Sensor Pixels Scaling down to 1.0 μm." *IEEE Transactions on Electron Devices* 57 (4): 788-94.

Zhao, Nathan, Peter B Catrysse, and Shanhui Fan. n.d. "Perfect RGB-IR Color Routers for Sub-Wavelength Size CMOS Image Sensor Pixels." *Advanced Photonics Research*, doi: 10.1002/adpr.202000048.

An illustrative version and several variants of a dielectric splitter and its use in an image sensor have been described above without any intended loss of generality. Further examples of modifications and variation are now provided. Still further variants, modifications and combinations thereof are contemplated and will be apparent to the person of skill in the art. It is to be understood that illustrative variants or modifications are provided for the purpose of enhancing the understanding of the person of skill in the art and are not intended as limiting statements.

For example, the splitter block may accommodate variation in size and shape that will generally be adapted to the type of photo-detector array and other features of an operational environment. The splitter will require a minimum thickness to split incident radiation into a plurality of beams and to focus the plurality of beams at or near the output surface of the block. Thickness is defined as a perpendicular distance between the input surface and the output surface of the block. A useful estimate for minimum thickness (t_min) for the splitter block is $$t_{min} = \frac{\lambda}{2(n_{high} - n_{low})} \quad \text{(Eq. 2)}$$

where lambda is the wavelength of an incident electromagnetic radiation (preferably the maximum wavelength of the incident electromagnetic radiation), and n_high and n_low are the real refractive indices of the high and low index materials. Eq. 2 is applicable is generally applicable to estimate minimum thickness for various electromagnetic radiation imaging implementations, and also accommodates splitter fabrication with three or more refractive indices as the highest and lowest refractive indices would remain determinative. In an illustrative example, of visible color imaging with a splitter block designed as shown in the Experimental Example, lambda is the wavelength of light (preferably the maximum wavelength), and n_high and n_low are the real refractive indices of the high and low index materials, where n_high=1.5 and n_low=1, and lambda=700 which gives t_min of 700 nm.

In another example of variation, the splitter is designed for splitting of incident radiation into a plurality of beams with near-field focus relative to the output surface of the splitter block. The near-field focus feature advantageously allows variation of positioning of the output surface of the splitter block near to the active layer surface of the pixel configured photo-detector array. The extent of the variation is that the separation of the active layer surface and output surface, which are oriented parallel and in facing opposition to each other, can be any perpendicular distance between the active layer surface and the output surface that is less than 600 nm. Typically, the separation of the active layer surface and the output surface is less than 500 nm. In an example, the separation of the active layer surface and the output surface is less than 450 nm. In another example, the separation of the active layer surface and the output surface is less than 400 nm. In another example, the separation of the active layer surface and the output surface is less than 350 nm. In another example, the separation of the active layer surface and the output surface is less than 300 nm. In another example, the separation of the active layer surface and the output surface is less than 250 nm. In another example, the separation of the active layer surface and the output surface is less than 200 nm. In another example, the separation of the active layer surface and the output surface is less than 150 nm. In another example, the separation of the active layer surface and the output surface is less than 100 nm. In another example, the separation of the active layer surface and the output surface is less than 50 nm.

The splitter output surface, similar to variation of the topology of the entire splitter block, can accommodate variation so long as splitter features of splitting incident radiation into a plurality of beams and focusing the plurality of beams at or near the output surface of the block are not eliminated. The output surface may often be configured and/or selected to enhance the splitter feature of focusing a plurality of beams at or near the output surface. For example, the output surface of the block may be configured with regions of lower intensity transmission to distinctly separate the plurality of beams such that each individual beam is localized and separated from neighboring beams at the output surface.

The splitter can be used in combination with many different pixel configured photo-detector array types, and may include for example a passive-pixel sensor or an active-pixel sensor. In other examples, the pixel configured photo-detector array types can include a CMOS sensor, an NMOS sensor or a CCD sensor.

The splitter can be manufactured by multiple techniques, for example by integrating a plurality of stacked layers or without stacking or layering and manufacturing in sub-blocks that are a different orientation than layers (ie, columnar or vertical orientation) or whole blocks is feasible. Manufacturing from a central point outwards may also be feasible.

A layer can be distinguished from a block in that within an individual layer xy dimensions of geometric structures remain unchanged at any point in the z dimension. In a layer structure, a first face (a first xy plane) is oriented towards the input surface of the block and a second face (a second xy plane) is oriented towards the output surface of the block, with thickness (z dimension) defined as a perpendicular distance between the first face and the second face. Within each layer the xy shape of each geometric structure remain unchanged throughout any point in the thickness (z dimension) of the layer. In contrast, in a block integrated from multiple layers, in traversing the thickness (z dimension) from the input surface to the output surface, the xy shape is expected to change in a stepwise manner in transition from a first layer to a second layer or from a second layer to a third layer, and so on for as many layers make up the block. By this distinction of the terms layer and block, a single layer that meets the sufficient minimum thickness set in Eq. 2 is indistinguishable from a block.

Figure 15:
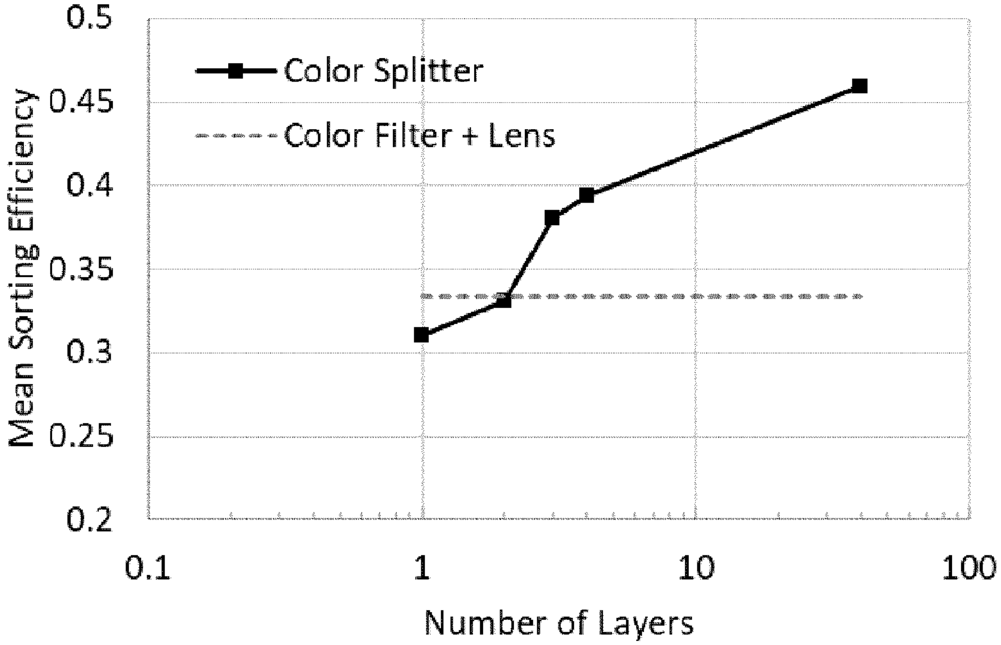
FIG. 15. Sorting efficiency of 1-layer, 2-layer, 3-layer, 4-layer, and 40-layer splitters compared to a filter and lens combination.
Figure 16:
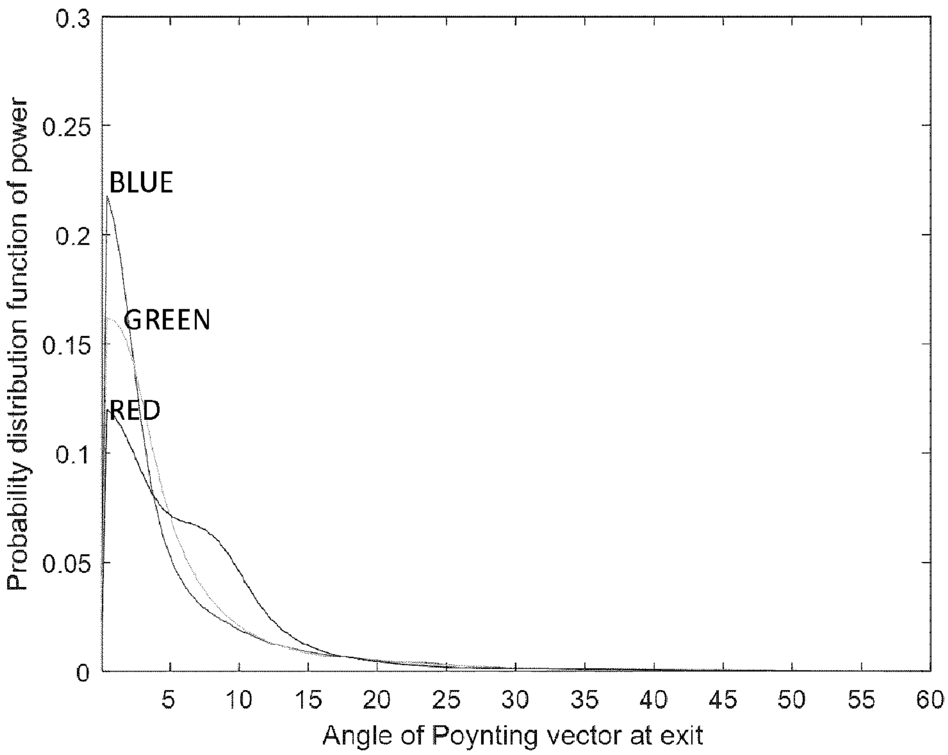
FIG. 16. Probability density function showing the distribution of angles at the output surface of the splitter for a test case of normal incident light received by the 3-layer splitter, showing distributions centered at approximately ~0 degrees.
Figure 17:
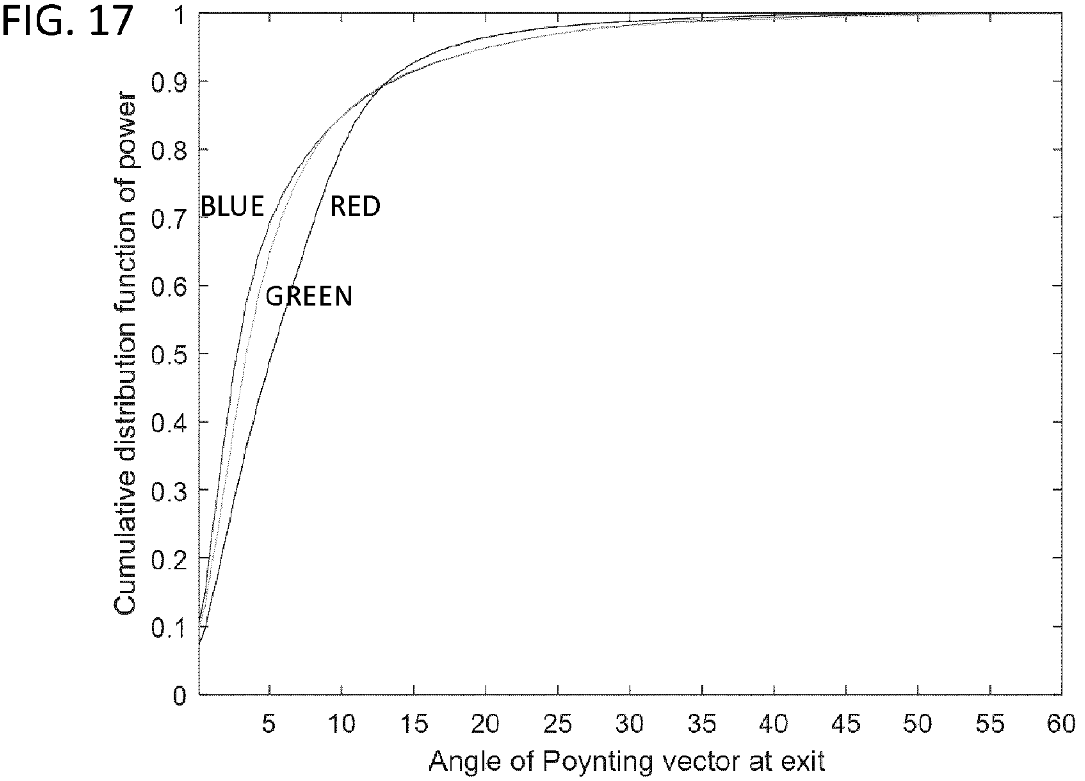
FIG. 17. Cumulative distribution function for normal incident light for the 3-layer splitter, showing that 80% of power exiting from the splitter is contained within 10 degrees of surface normal.
Figure 18:
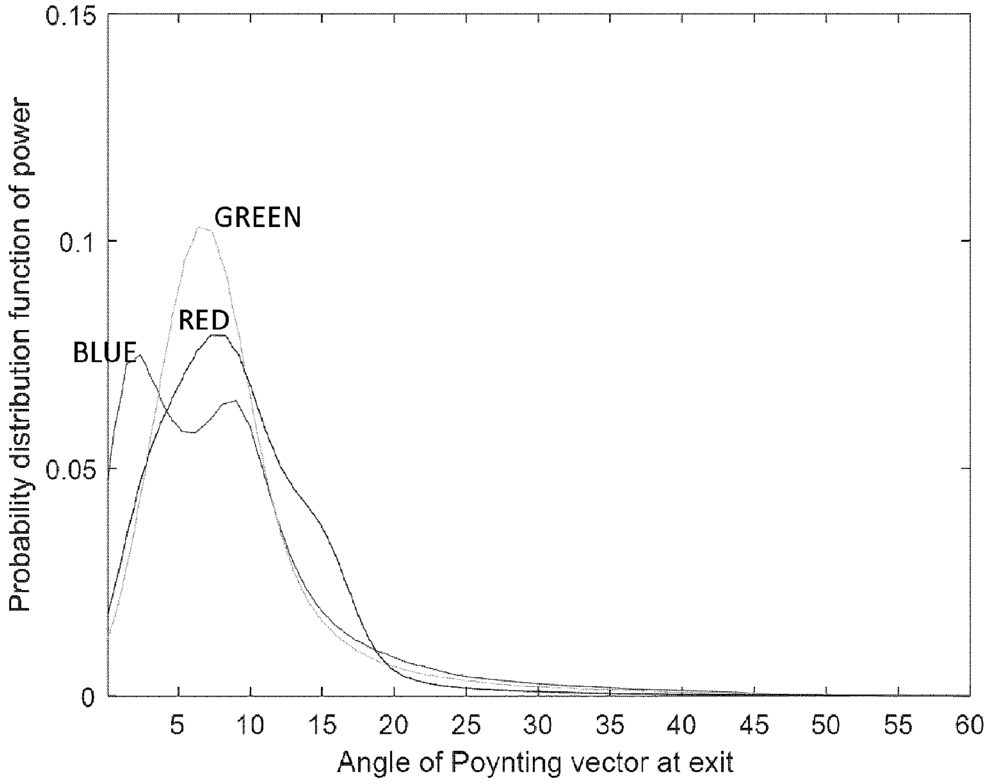
FIG. 18. Probability density function showing the distribution of angles at the output surface of the splitter for a test case of an incident angle of 10 degrees for the 3-layer splitter, showing distributions centered around ~10 degrees.
Figure 19:
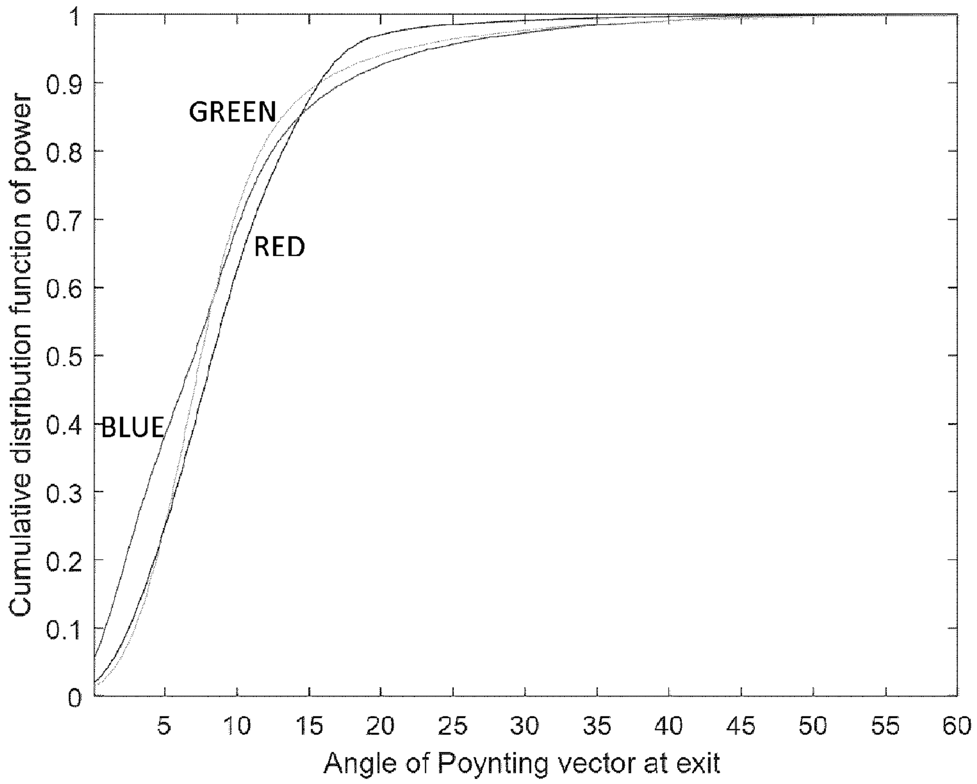
FIG. 19. Cumulative distribution function for incident angle of 10 degrees for the the 3-layer splitter, showing >80% of power is contained within 10 degrees of the incident angle of 10 degrees (i.e. from 0 to 20 degrees).

In certain examples, the splitter may be made as a single formed block or may be an integration or may be a plurality of stacked layers that are integrated to form the block and the plurality of geometric structures. When made from a plurality of stacked layers the number of stacked layers is often greater than 2 layers, greater than 3 layers, greater than 4 layers, greater than 5 layers, greater than 10 layers, greater than 15 layers, greater than 20 layers, greater than 25 layers, greater than 30 layers, greater than 35 layers or greater than any number of layers therebetween. A full 3D splitter is considered to be 40 stacked layers for purposes of the Experimental Example only. But, in other implementations a full 3D splitter may be stacked layers that number fewer or greater than 40. In certain examples, a full 3D splitter can be any number of stacked layers greater than 10 layers. In other examples, a full 3D splitter can be any number of stacked layers greater than 20 layers. Experimental observation has validated a splitter block made of three or more layers as reliably performing better than a filter in comparable performance metrics (ie., even when discounting or not comparing metrics relating to attenuation of incident radiation intensity as filters compare exceedingly poorly in such metrics). FIG. 15 shows a plot of mean sorting efficiency as an example of such a comparable metric. The mean sorting efficiency for a color imaging implementation is determined consistent with methods described in the Experimental Example and is plotted with data points for a 1-layer splitter, a 2-layer splitter, a 3-layer splitter, a 4-layer splitter and a 40-layer splitter and the plot is compared to a mean sorting efficiency value (dashed line) for a conventionally available filter with microlens added. Sorting efficiency is the fraction of light that is collected by the correct color pixel (e.g. blue light that goes to the active region of the blue pixel). Here we take the arithmetic mean of three colors (reg/green/blue). In this performance metric the 2-layer splitter is similar to the combination of a filter and lens, while a 3-layer splitter is clearly superior to filter and lens combination.

When a splitter is made from a plurality of stacked layers size and shape of the stacked layers may vary from block-to-block and may even very within a specific block. Furthermore, even within an individual layer, dimensions of length, width and thickness need not be constant, and considerable variation can occur and can be intended. In a layer structure, a first face (a first xy plane) is oriented towards the input surface of the block and a second face (a second xy plane) is oriented towards the output surface of the block, with thickness (z dimension) defined as a perpendicular distance between the first face and the second face. This thickness can be uniform or varied as desired for a particular implementation. In certain examples, the layers are of uniform thickness throughout the block. In other examples, the layers are of differing thickness throughout the block. In still other examples, at least one layer within a block has a varying thickness (ie., perpendicular distance between the first and second faces of the layer) along a perimeter or a diameter of the layer or a varying thickness when considering two or more points of the layer. In further examples, at least one layer within a block has a uniform thickness at all points.

The dielectric splitter can be incorporated in many types of image sensors and benefits multiple imaging implementations, including for example, digital cameras, camera modules, camera phones, optical mouse devices, medical imaging equipment, night vision equipment such as thermal imaging devices, microwave imaging devices, ultraviolet imaging devices, biological imaging, machine vision, smart sensing materials, real-time motion detection, high resolution imaging, aerospace imaging, among others. The adjoint-based inverse design illustrates an approach that can be readily adapted to splitter configurations for multiple imaging implementations. A similar design and analysis approach as demonstrated in the Experimental Example could be readily adapted to other applications, such as infrared imaging or multi-junction photovoltaics, and may be well suited to applications where splitting and near-field focusing are both advantageous.

The splitter can be made of a single dielectric material, but can also be readily adapted to be made of combination of two dielectric materials or combination of three dielectric materials or combinations of more than three dielectric materials. Ease of manufacture and cost of production may benefit from a single dielectric material particularly in high volume applications such as consumer electronics, but in more specific and higher margin applications two or more dielectric materials may be used as desired. Dielectric materials with low-refractive index ($n<2$) can provide cost and other benefits in manufacturing scale, however use of dielectric materials with high-refractive index ($n>2$) may be accommodated and may even be desired in specific implementations, for example in implementations where two or more dielectric materials are combined to form a splitter. Common dielectric materials are magnesium fluoride ($n=1.4$), silicon dioxide ($n=1.5$), tantalum pentoxide ($n=2.3$), zinc sulfide ($n=2.3$), and titanium dioxide ($n=2.4$). and silicon nitride ($n=2.1$), as well as polymer materials such as poly(methyl methacrylate (PMMA: $n=1.5$), polydimethylsiloxane (PDMS: $n=1.4$), polyvinylchloride (PVC: $n=1.5$). Another dielectric material option is a photoresist (also known simply as a resist) which is a light-sensitive material, typically a polymer, used in processes, such as photolithography and photoengraving. In the case of a positive photoresist, the photo-sensitive material is degraded by light and the developer will dissolve away the regions that were exposed to light. In the case of a negative photoresist, the photosensitive material is strengthened (either polymerized or cross-linked) by light, and the developer will dissolve away only the regions that were not exposed to light.

The dielectric splitter can be manufactured by multiple available techniques. Illustrative options for manufacture of single layer structures include conventional UV lithography, direct-write lithography, or electron beam lithography.

Option 1.1—Conventional UV lithography. Single layer structures should be relatively trivial to produce using standard patterning of photoresist using deep-UV or extreme-UV photolithography, depending on the specific resolution desired of the structures. The patterned photoresist could either work as an etch mask to allow creation of high-index structures, or directly as the splitter layer itself. This would allow fast fabrication of single layer structures utilizing the same CMOS processing techniques already employed in sensor fabrication.

Benefits—Fast processing (time per chip), fast development cycle (using a ubiquitous process), allows potential for high refractive index material when used as an etch mask.

Drawbacks—Limited to single layer structures which show limited efficiency, requires high resolution exposure mask which would be relatively expensive if only small numbers of pixels are being used for tests (e.g. a sub-region in one sensor).

Option 1.2—Direct-write lithography. Single-photon or multi-photon direct write lithography would also be possible to replace traditional UV lithography, using a focused laser beam, possibly utilizing a two-photon absorption process, to write into the photoresist without need for a photomask.

Benefits—Fast development cycle (common process), allows potential for high refractive index material when used as an etch mask.

Drawbacks—Limited to single layer structures which show limited efficiency, would be slow to use for a full 3D splitter due to point-by-point writing, single-photon lithography may have too low resolution for sufficient performance.

Option 1.3—Electron beam lithography. Similar to direct-write lithography, but using a focused electron beam instead of a focused laser beam, thereby allowing much higher resolution.

Benefits—Fast development cycle (ubiquitous process), allows potential for high refractive index material when used as an etch mask, extremely high resolution can be achieved.

Drawbacks—Limited to single layer structures which show limited efficiency, would be slow to use for a full 3D splitter due to point-by-point writing, higher resolution generally trades off with longer write times.

Illustrative options for manufacture of structures of a few stacked layers (eg., 2-5 layers) include multi-step UV photolithography, sequential nanoimprint lithography, or micro-transfer printing.

Option 2.1—Multi-step UV photolithography. Repeated steps of single-layer lithography can build up more complex 2.5D structures. Two layers have been demonstrated previously (C. Greiner, E. Arzt, and A. del Campo, "Hierarchical gecko-like adhesives," Advanced Materials, vol. 21, no. 4, pp. 479-482, 2009.).

Benefits—Fast processing (time per chip), fast development cycle (using a ubiquitous process), allows potential for high refractive index material if etch mask thicknesses are tuned precisely, compatible with soft lithography as well (using the structures created via this method as a mold).

Drawbacks—Layers must be fully supported by the layer below (overhanging structures are not possible), requires multiple high resolution exposure masks, difficulty increases with increasing number of layers.

Option 2.2—Sequential nanoimprint lithography. Nanoimprint lithography uses a mold pressed into an uncured polymer material to transfer a pattern through mechanical deformation. After imprint, the polymer is cured. Repeated steps nanoimprint before curing can also produce 2.5D structures. Two layers have been demonstrated previously (F. Zhang and H. Y. Low, "Ordered three-dimensional hierarchical nanostructures by nanoimprint lithography," Nanotechnology, vol. 17, no. 8, pp. 1884-1890, 2006.).

Benefits—Fast processing (time per chip), allows potential for high refractive index material if etch mask thicknesses are tuned precisely.

Drawbacks—Layers must be fully supported by the layer below (overhanging structures are not possible), may require smaller and thinner upper layer vs the base layer, requires multiple imprint molds, second imprint step could complicate the design of the first step to prevent degradation, alignment can be more difficult than in photolithography, difficulty increases with increasing number of layers.

Option 2.3—Micro-transfer printing. A mold, similar to that in nanoimprint lithography, can be filled with polymer material, and then transferred onto a substrate. This can then be repeated to build up a layered structure. This has been demonstrated for multiple layers, with overhangs (Zhao, Xiao-Mei, Younan Xia, and George M. Whitesides. "Fabrication of three-dimensional micro-structures: Microtransfer molding." Advanced Materials vol. 8, no. 10, pp. 837-840, 1996.)

Benefits—Relatively fast processing (time per chip), can allow multiple (3+) layers to be built up with less difficulty than other methods for a few stacked layers, does not limit to 2.5D structures (overhangs are possible).

Drawbacks—There may be challenges to ensure full transfer of the pattern may require more complex processing (e.g. addition of sacrificial release layers that are dissolved), still some design limitations, as certain types of structures (e.g. cantilevers) are likely not possible, alignment can be more difficult than in photolithography.

Illustrative options for manufacture of structures of fully 3D structures (eg., 10 or more layers) include multi-photon nanolithography or focused electron beam-induced deposition (FEBID).

Option 3.1—Multi-photon nanolithography. Complex 3D structures can be directly written into photoresist using two-photon absorption process. (Johlin, Eric, Sander A. Mann, Sachin Kasture, A. Femius Koenderink, and Erik C. Garnett. "Broadband highly directive 3D nanophotonic lenses." Nature communications 9, no. 1, pp. 4742, 2018). Dip-in liquid lithography (DILL), where the liquid photoresist works as the immersion liquid in direct contact with the focusing objective, can be used for printing on non-transparent substrates.

Benefits—High resolution fully 3D structures can be fabricated which show highest performance computationally, no mask or mold needed, relatively fast development time.

Drawbacks—Relatively slow printing time (writing point-at-a-time for a 3D structure), can be complications from reflections off of the substrate in DILL.

Option 3.2—Focused electron beam-induced deposition (FEBID). Precursor gas is injected into an electron beam lithography (or microscopy) setup, the gas adsorbs on the sample surface, and an electron beam causes decomposition of the precursor molecules leading to solid deposition at the exposed location. This has been shown to allow fabrication of arbitrary 3D geometries (Skoric, Luka, Dedalo Sanz-Hernandez, Fanfan Meng, Claire Donnelly, Sara Merino-Aceituno, and Amalio Fernández-Pacheco. "Layer-by-layer growth of complex-shaped three-dimensional nanostructures with focused electron beams." Nano Letters 20, no. 1, pp. 184-191, 2019).

Benefits—High resolution fully 3D structures can be fabricated which show highest performance computationally, no mask or mold needed, extremely high resolutions (tens of nanometers) are possible, many materials possible through choice of precursor gas.

Drawbacks—Relatively slow printing time (writing point-at-a-time for a 3D structure), stochastic adsorption process can limit writing speeds, angle of overhang structures may be limited or require tilting of substrates.

Embodiments described herein are intended for illustrative purposes without any intended loss of generality. Still further variants, modifications and combinations thereof are contemplated and will be recognized by the person of skill in the art. Accordingly, the foregoing detailed description is not intended to limit scope, applicability, or configuration of claimed subject matter.

What is claimed is:

1. An image sensor comprising:

a splitter comprising a block of structured dielectric material with a plurality of nano-photonic geometric structures formed therein, an incident electromagnetic radiation split into a plurality of substantially parallel beams of spectrally distinct electromagnetic wavelength ranges by transmission through the plurality of nano-photonic geometric structures;

the block having an input surface for receiving the incident electromagnetic radiation and an output surface for transmitting the plurality of substantially parallel beams of spectrally distinct electromagnetic wavelength ranges, the input surface and the output surface independently communicative with the plurality of nano-photonic geometric structures, the output surface of the block configured with regions of lower intensity transmission to distinctly separate the plurality of substantially parallel beams;

a pixel configured photo-detector array providing an active layer surface receiving the plurality of substantially parallel beams of spectrally distinct electromagnetic wavelength ranges;

the active layer surface oriented in facing opposition to the output surface of the block, a separation of the active layer surface and the output surface being less than 500 nanometers.

2. The image sensor of claim 1, wherein the splitter provides near-field focus in that focus of the plurality of substantially parallel beams of spectrally distinct electromagnetic wavelength ranges transmitted from the splitter output surface is characterized by a working distance of less than 500 nm relative to the output surface and a minimum focus distance of less than 300 nm relative to the output surface.

3. The image sensor of claim 1, wherein the splitter provides angular conservation in that the incident electromagnetic radiation received at a normal angle to the input surface corresponds to the plurality of substantially parallel beams of spectrally distinct electromagnetic wavelength ranges transmitted from the splitter output surface in an angular range of less than 20 degrees from a normal angle relative to the output surface.

4. The image sensor of claim 1, wherein the block is configured according to an adjoint-based inverse design simulation specifying parameters including the separation between the active layer surface and output surface being less than 500 nm, and a single dipole centrally located within each pixel of the pixel configured photo-detector array.

5. The image sensor of claim 1, wherein the separation of the active layer surface and the output surface is less than 300 nm, is less than 200 nm, is less than 100 nm, is less than 50 nm, is approximately zero, or is zero.

6. The image sensor of claim 1, wherein the block is formed of a single dielectric material.

7. The image sensor of claim 6, wherein the refractive index of the single dielectric material is less than 2.

8. The image sensor of claim 1, wherein a plurality of stacked layers are integrated to form the block and the plurality of geometric structures.

9. The image sensor of claim 8, wherein the plurality of stacked layers includes at least 3 layers.

10. The image sensor of claim 8, wherein the plurality of stacked layers includes at least 4 layers.

11. The image sensor of claim 1, wherein the block is configured according to an adjoint-based inverse design simulation specifying parameters including the separation between the active layer surface and output surface being less than 500 nm, and multiple dipoles located within each pixel of the pixel configured photo-detector array.

12. The image sensor of claim 1, wherein the image sensor is a visible color image sensor, an ultraviolet image sensor, an infrared image sensor, or a microwave image sensor.

13. An image sensor comprising:

a splitter comprising a block of structured dielectric material with a plurality of nano-photonic geometric structures formed therein, an incident electromagnetic radiation split into a plurality of substantially parallel beams of spectrally distinct electromagnetic wavelength ranges by transmission through the plurality of nano-photonic geometric structures;

the block having an input surface for receiving the incident electromagnetic radiation and an output surface for transmitting the plurality of substantially parallel beams of spectrally distinct electromagnetic wavelength ranges, the input surface and the output surface independently communicative with the plurality of nano-photonic geometric structures, the block formed of a single dielectric material;

a pixel configured photo-detector array providing an active layer surface receiving the plurality of substantially parallel beams of spectrally distinct electromagnetic wavelength ranges;

the active layer surface oriented in facing opposition to the output surface of the block, a separation of the active layer surface and the output surface being less than 500 nanometers.

14. The image sensor of claim 13, wherein the refractive index of the single dielectric material is less than 2.

15. The image sensor of claim 14, wherein the block is configured according to an adjoint-based inverse design simulation specifying parameters including the separation between the active layer surface and output surface being less than 500 nm, and a single dipole centrally located within each pixel of the pixel configured photo-detector array.

16. The image sensor of claim 14, wherein the block is configured according to an adjoint-based inverse design simulation specifying parameters including the separation between the active layer surface and output surface being less than 500 nm, and multiple dipoles located within each pixel of the pixel configured photo-detector array.

17. The image sensor of claim 14, wherein the output surface of the block is configured with regions of lower intensity transmission to distinctly separate the plurality of substantially parallel beams.

18. The image sensor of claim 13, wherein the splitter provides near-field focus in that focus of the plurality of substantially parallel beams of spectrally distinct electromagnetic wavelength ranges transmitted from the splitter output surface is characterized by a working distance of less than 500 nm relative to the output surface and a minimum focus distance of less than 300 nm relative to the output surface.

19. The image sensor of claim 13, wherein the splitter provides angular conservation in that the incident electromagnetic radiation received at a normal angle to the input surface corresponds to the plurality of substantially parallel beams of spectrally distinct electromagnetic wavelength ranges transmitted from the splitter output surface in an angular range of less than 20 degrees from a normal angle relative to the output surface.

20. The image sensor of claim 13, wherein the block is configured according to an adjoint-based inverse design simulation specifying parameters including the separation between the active layer surface and output surface being less than 500 nm, and a single dipole centrally located within each pixel of the pixel configured photo-detector array.

21. The image sensor of claim 13, wherein the block is configured according to an adjoint-based inverse design simulation specifying parameters including the separation between the active layer surface and output surface being less than 500 nm, and multiple dipoles located within each pixel of the pixel configured photo-detector array.

22. The image sensor of claim 13, wherein the separation of the active layer surface and the output surface is less than 300 nm, is less than 200 nm, is less than 100 nm, is less than 50 nm, is approximately zero, or is zero.

23. The image sensor of claim 13, wherein the output surface of the block is configured with regions of lower intensity transmission to distinctly separate the plurality of substantially parallel beams.

24. The image sensor of claim 13, wherein a plurality of stacked layers are integrated to form the block and the plurality of geometric structures.

25. The image sensor of claim 24, wherein the plurality of stacked layers includes at least 3 layers.

26. The image sensor of claim 24, wherein the plurality of stacked layers includes at least 4 layers.

27. The image sensor of claim 13, wherein the image sensor is a visible color image sensor, an ultraviolet image sensor, an infrared image sensor, or a microwave image sensor.

* * * * *